US009721975B2

(12) United States Patent
Sogabe et al.

(10) Patent No.: US 9,721,975 B2
(45) Date of Patent: Aug. 1, 2017

(54) SEMICONDUCTOR DEVICE, DISPLAY DEVICE, AND ELECTRONIC DEVICE

(71) Applicant: Japan Display Inc., Tokyo (JP)

(72) Inventors: Mitsufumi Sogabe, Aichi (JP); Masaki Murase, Aichi (JP); Hiroshi Mizuhashi, Kanagawa (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/793,477

(22) Filed: Jul. 7, 2015

(65) Prior Publication Data

US 2015/0311228 A1 Oct. 29, 2015

Related U.S. Application Data

(63) Continuation of application No. 14/514,798, filed on Oct. 15, 2014, now Pat. No. 9,111,808, which is a (Continued)

(30) Foreign Application Priority Data

Apr. 27, 2011 (JP) .................................. 2011-099345

(51) Int. Cl.
*G06F 3/045* (2006.01)
*H01L 27/12* (2006.01)
(Continued)

(52) U.S. Cl.
CPC ........ *H01L 27/124* (2013.01); *G02F 1/13338* (2013.01); *G02F 1/13454* (2013.01);
(Continued)

(58) Field of Classification Search
CPC ............... H01L 27/124; H01L 27/1222; H01L 27/1255; H01L 23/528; H01L 29/78648;
(Continued)

(56) References Cited

U.S. PATENT DOCUMENTS 6,028,580 A * 2/2000 Kosegawa .............. H01L 27/12
257/72
6,614,417 B2 9/2003 Murade
(Continued)

FOREIGN PATENT DOCUMENTS

JP 09-97909 4/1997
JP 11-214700 8/1999
(Continued)

OTHER PUBLICATIONS

Taiwan Office Examination Report issued in connection with related Taiwan Patent Application No. TW 101111180 dated Aug. 22, 2014.
(Continued)

*Primary Examiner* — Lun-Yi Lao
*Assistant Examiner* — Jarurat Suteerawongsa
(74) *Attorney, Agent, or Firm* — Dentons US LLP

(57) ABSTRACT

A semiconductor device including: one or more pieces of first wiring having a main wiring section and a bifurcation wiring section; one or a plurality of pieces of second wiring having a trunk wiring section and a plurality of branch wiring sections within a gap region between the main wiring section and the bifurcation wiring section; one or a plurality of transistors each divided and formed into a plurality of pieces, the plurality of branch wiring sections individually functioning as a gate electrode and the one or plurality of transistors having a source region formed within the main wiring section and within the bifurcation wiring section and having a drain region formed between the plurality of branch wiring sections; and one or a plurality of pieces of third wiring electrically connected to the drain region of the one or plurality of transistors.

7 Claims, 18 Drawing Sheets

Related U.S. Application Data continuation of application No. 13/449,442, filed on Apr. 18, 2012, now Pat. No. 8,884,919.

(51) Int. Cl.

| | | |
|---|---|---|
| *G06F 3/041* | (2006.01) | |
| *G06F 3/044* | (2006.01) | |
| *G02F 1/1333* | (2006.01) | |
| *G02F 1/1345* | (2006.01) | |
| *H01L 23/528* | (2006.01) | |
| *H01L 29/786* | (2006.01) | |
| *G06F 3/038* | (2013.01) | |

(52) U.S. Cl.
CPC ............ *G06F 3/044* (2013.01); *G06F 3/0412* (2013.01); *H01L 23/528* (2013.01); *H01L 27/1222* (2013.01); *H01L 27/1255* (2013.01); *H01L 29/78648* (2013.01); *G06F 3/038* (2013.01); *G06F 3/045* (2013.01); *H01L 2924/0002* (2013.01)

(58) Field of Classification Search
CPC ........... H01L 2924/0002; G06F 3/0412; G06F 3/044; G06F 3/045; G06F 3/038; G02F 1/13338; G02F 1/13454
See application file for complete search history.

(56) References Cited

U.S. PATENT DOCUMENTS

| | | |
|---|---|---|
| 7,394,446 B2 | 7/2008 | Park |
| 8,035,634 B2 | 10/2011 | Yamazaki |
| 8,884,919 B2 * | 11/2014 | Sogabe ................ H01L 27/124 |
| | | 345/174 |
| 9,111,808 B2 * | 8/2015 | Sogabe ................ H01L 27/124 |
| 2003/0085405 A1 | 5/2003 | Park |
| 2008/0055300 A1 * | 3/2008 | Yamazaki ............ G09G 3/3655 |
| | | 345/212 |
| 2009/0322716 A1 * | 12/2009 | Azami ............. H03K 19/01714 |
| | | 345/204 |
| 2011/0157110 A1 | 6/2011 | Chou et al. |

FOREIGN PATENT DOCUMENTS

| | | |
|---|---|---|
| JP | 2000-310963 | 11/2000 |
| JP | 2002-299631 | 10/2002 |
| JP | 2006-337710 | 12/2006 |
| JP | 2009-169043 | 7/2009 |
| JP | 2011- 08726 | 1/2011 |
| TW | 559764 | 11/2003 |

OTHER PUBLICATIONS

Japanese Office Action issued in connection with related Japanese patent application No. 2011-099345 dated Apr. 8, 2014.

* cited by examiner

FIG.1A
FIG.1B
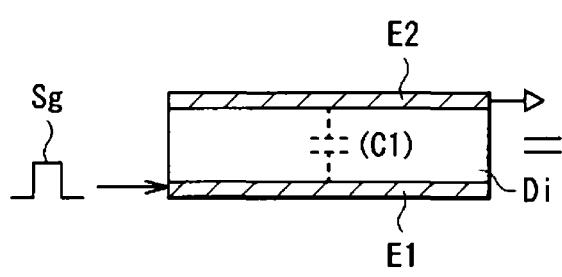
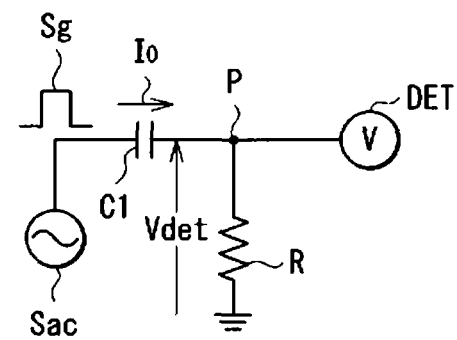
FIG.2A
FIG.2B
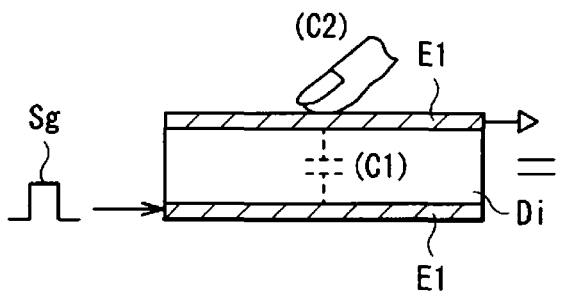
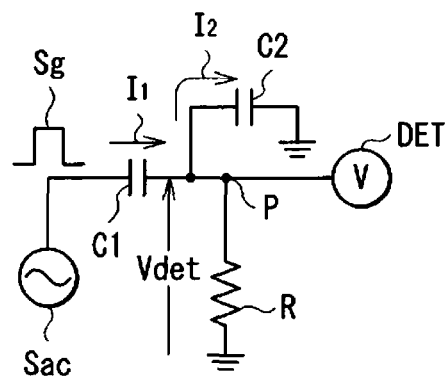
FIG.3A
FIG.3B
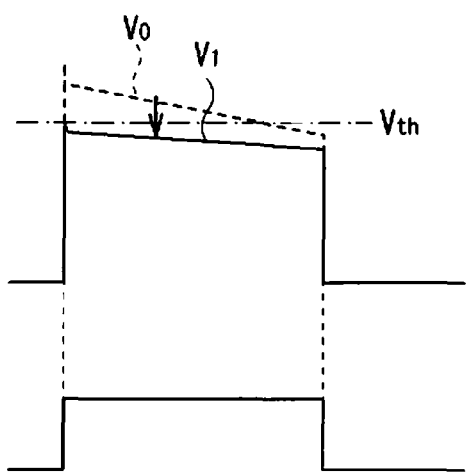

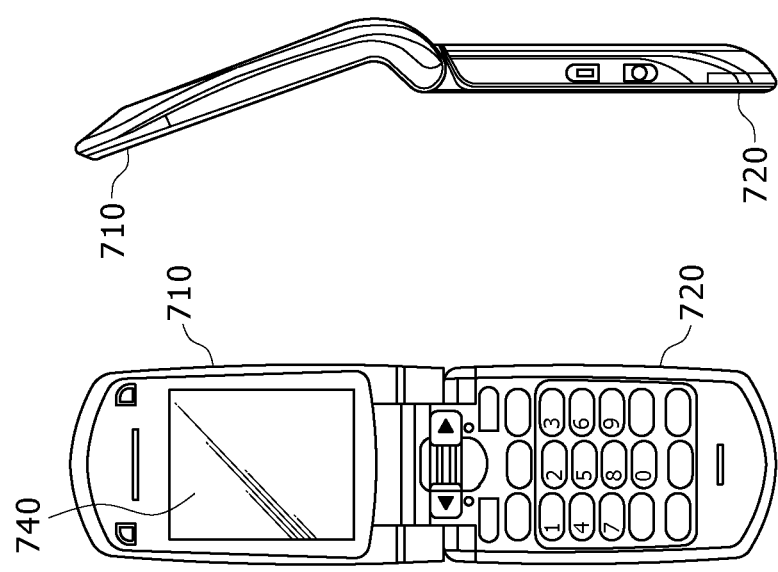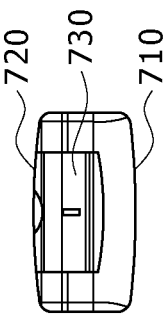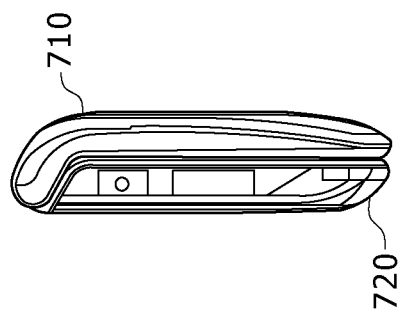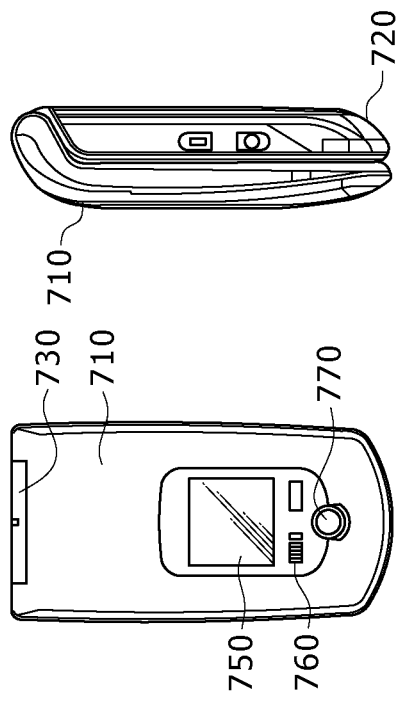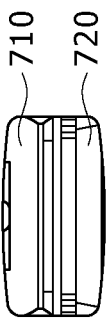

SEMICONDUCTOR DEVICE, DISPLAY DEVICE, AND ELECTRONIC DEVICE

RELATED APPLICATION DATA

This application is a continuation of U.S. patent application Ser. No. 14/514,798 filed Oct. 15, 2014 which is a continuation of U.S. patent application Ser. No. 13/449,442 filed Apr. 18, 2012, now U.S. Pat. No. 8,884,919 issued Nov. 11, 2014, the entireties of which are incorporated herein by reference to the extent permitted by law. The present application claims the benefit of priority to Japanese Patent Application No. JP 2011-099345 filed on Apr. 27, 2011 in the Japan Patent Office, the entirety of which is incorporated by reference herein to the extent permitted by law.

BACKGROUND

The present disclosure relates to a semiconductor device having a predetermined circuit including a transistor as well as a display device and an electronic device including such a semiconductor device.

In related art, display devices using display elements of various types such as liquid crystal elements and organic EL (Electro Luminescence) elements have been developed. Such a display device generally has a peripheral circuit disposed in a frame region (non-display region) situated at an outer edge (perimeter) of a display region (effective display region) having a plurality of pixels.

This peripheral circuit includes a driving circuit (semiconductor device) for driving the plurality of pixels and the like. The driving circuit includes for example a scanning line driving circuit (vertical driving circuit) for sequentially driving the plurality of pixels and a signal line driving circuit (horizontal driving circuit) for supplying a video signal to pixels as driving objects. The vertical driving circuit is generally formed by using a plurality of buffer circuits and the like (see Japanese Patent Laid-Open No. 2009-169043, for example).

SUMMARY

There has recently been a tendency to desire that a display device has a narrower frame (reduction in the area of a frame region). However, when wiring width or the like within a peripheral circuit (semiconductor device) is simply reduced, the circuit characteristics (operating characteristics) and the like of the peripheral circuit are degraded. As a result, display image quality is lowered (for example a flicker phenomenon occurs). The proposition of a method for achieving space saving (area saving) while suppressing degradation in the characteristics is therefore desired.

The present disclosure is made in view of the above problem. It is desirable to provide a semiconductor device, a display device, and an electronic device that make it possible to achieve space saving while suppressing degradation in characteristics.

According to an embodiment of the present disclosure, there is provided a semiconductor device including: one or a plurality of pieces of first wiring extending along a first direction on a substrate and having a main wiring section and a bifurcation wiring section arranged so as to be separated from each other; one or a plurality of pieces of second wiring having a trunk wiring section extending along a second direction different from the first direction on the substrate and a plurality of branch wiring sections extending along the first direction within a gap region between the main wiring section and the bifurcation wiring section; one or a plurality of transistors each divided and formed into a plurality of pieces along the second direction, the plurality of branch wiring sections individually functioning as a gate electrode, and the one or plurality of transistors having a source region formed within the main wiring section and within the bifurcation wiring section and having a drain region formed between the plurality of branch wiring sections; and one or a plurality of pieces of third wiring extending along the second direction and electrically connected to the drain region of the one or plurality of transistors.

A display device according to another embodiment of the present disclosure includes a display section and a driving section having the semiconductor device according to the above-described embodiment of the present disclosure.

An electronic device according to a further embodiment of the present disclosure includes the display device according to the above-described embodiment of the present disclosure.

In the semiconductor device, the display device, and the electronic device according to the embodiments of the present disclosure, the first wiring extending along the first direction includes the main wiring section and the bifurcation wiring section. The source regions of the transistor are formed within the main wiring section and within the bifurcation wiring section. In addition, the second wiring includes the trunk wiring section extending along the second direction and the plurality of branch wiring sections extending along the first direction. The drain region of the transistor is formed between the plurality of branch wiring sections. Further, the third wiring extending along the second direction is electrically connected to the drain region of the transistor. The transistor is divided and formed into a plurality of pieces along the second direction. The above-described plurality of branch wiring sections individually function as respective gate electrodes in the transistor formed in a divided manner. Thus, the transistor whose gate electrodes extend along the first direction (are arranged along the first direction) is divided and formed into a plurality of pieces along the second direction different from the first direction, and the main wiring section and the bifurcation wiring section arranged so as to be separated from each other include the source regions of the transistor. Thereby, the efficiency of arrangement in the second direction of the semiconductor device as a whole is improved (arrangement width along the second direction is reduced) while the wiring width of the first wiring (wiring width along the second direction of the main wiring section and the bifurcation wiring section) is secured.

According to the semiconductor device, the display device, and the electronic device according to the embodiments of the present disclosure, because the first to third wiring and the transistor are provided, the efficiency of arrangement in the second direction of the semiconductor device as a whole can be improved while the wiring width along the second direction of the first wiring is secured. It is consequently possible to achieve space saving while suppressing degradation in characteristics (for example degradation in display image quality).

BRIEF DESCRIPTION OF THE DRAWINGS

FIGS. 1A and 1B are diagrams explaining principles of operation of a display device provided with a touch sensor, and are diagrams showing a state when no finger is in contact with the touch sensor;

FIGS. 2A and 2B are diagrams explaining principles of operation of the display device provided with the touch sensor, and are diagrams showing a state when a finger is in contact with the touch sensor;

FIGS. 3A and 3B are diagrams explaining principles of operation of the display device provided with the touch sensor, and are diagrams showing an example of waveforms of a driving signal and a detection signal of the touch sensor;

FIG. 19 is a perspective view of an external appearance as viewed from a front side in a first application example of the display device according to each of the above embodiments and the like;

FIG. 23A is a front view of an opened state in a fifth application example, FIG. 23B is a side view thereof, FIG. 23C is a front view of a closed state, FIG. 23D is a left side view, FIG. 23E is a right side view, FIG. 23F is a top view, and FIG. 23G is a bottom view.

DETAILED DESCRIPTION OF THE PREFERRED EMBODIMENTS

Figure 4:
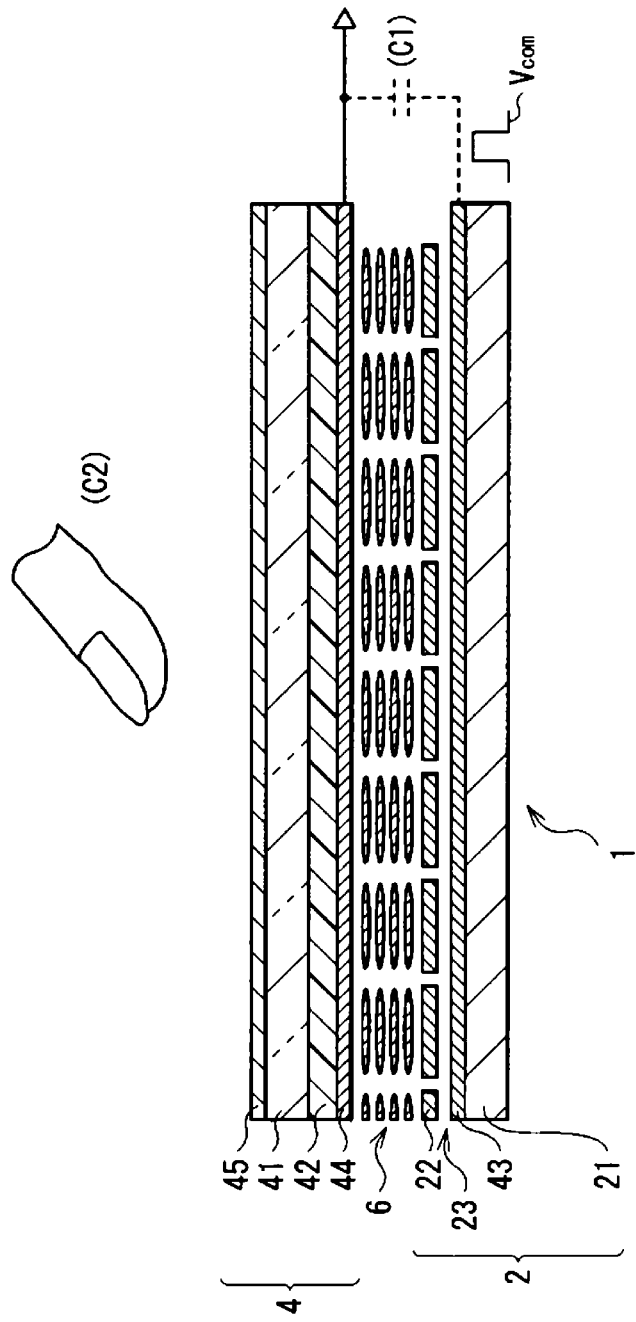
FIG. 4 is a sectional view of a schematic sectional structure of a display device including a semiconductor device (display device provided with a touch sensor) according to a first embodiment of the present disclosure.

Embodiments of the present disclosure will hereinafter be described in detail with reference to the drawings. Incidentally, description will be made in the following order.
1. Basic Principles of Touch Detecting System in Display Device Provided with Touch Sensor
2. First Embodiment (Example of Transistors Being Divided and Formed into Even Number of Pieces)
3. Second Embodiment (Example of Transistors Being Divided and Formed into Odd Number of Pieces)
4. Modification Examples Common to First and Second Embodiments
   First Modification Example (Example of Providing Through Holes in Parts of Wiring of Power Supply Lines)
   Second Modification Example (Example of Application to Inverter Circuit instead of Buffer Circuit)
5. Application Examples (Application Examples of Display Devices to Electronic Devices)
6. Other Modification Examples

1. Basic Principles of Touch Detecting System in Display Device Provided with Touch Sensor Basic principles of a touch detecting system in display devices (display devices provided with a touch sensor) according to the following embodiments and the like will first be described with reference to FIGS. 1A to 3B. The touch detecting system is embodied as a capacitance type touch sensor. As shown in FIG. 1A, for example, a capacitance element is formed by using a pair of electrodes (a driving electrode E1 and a detecting electrode E2) arranged so as to be opposed to each other with a dielectric Di sandwiched therebetween. This structure is represented as an equivalent circuit shown in FIG. 1B. The driving electrode E1, the detecting electrode E2, and the dielectric Di form a capacitance element C1. One terminal of the capacitance element C1 is connected to an alternating-current signal source (driving signal source) $S_{ac}$. The other terminal P of the capacitance element C1 is grounded via a resistor R and is connected to a voltage detector (detecting circuit) DET. When an alternating-current rectangular wave $S_g$ (FIG. 3B) of a predetermined frequency (a few kHz to a few more than ten kHz, for example) is applied from the alternating-current signal source $S_{ac}$ to the driving electrode E1 (one terminal of the capacitance element C1), an output waveform (detection signal $V_{det}$) as shown in FIG. 3A appears at the detecting electrode E2 (the other terminal P of the capacitance element C1). Incidentally, this alternating-current rectangular wave $S_g$ corresponds to a common driving signal $V_{com}$ to be described later.

In a state of no finger being in contact with (or in proximity to) the detecting electrode E2, as shown in FIGS. 1A and 1B, a current $I_0$ corresponding to the capacitance value of the capacitance element C1 flows as the capacitance element C1 is charged and discharged. The other terminal P of the capacitance element C1 at this time has a potential waveform such as a waveform $V_0$ in FIG. 3A, for example. This waveform is detected by the voltage detector DET.

On the other hand, in a state of a finger being in contact with (or in proximity to) the detecting electrode E2, as shown in FIGS. 2A and 2B, a capacitance element C2 formed by the finger is added in series with the capacitance element C1. In this state, as the capacitance elements C1 and C2 are charged and discharged, respective currents $I_1$ and $I_2$ flow. The other terminal P of the capacitance element C1 at this time has a potential waveform such as a waveform $V_1$ in FIG. 3A, for example. This waveform is detected by the voltage detector DET. At this time, the potential of the point P is a divided-voltage potential determined by the values of the currents $I_1$ and $I_2$ flowing through the capacitance elements C1 and C2. The waveform $V_1$ therefore has a smaller value than the waveform $V_0$ in the noncontact state. As will be described later, the voltage detector DET compares the detected voltage with a predetermined threshold voltage $V_{th}$. When the detected voltage is equal to or higher than the threshold voltage, the voltage detector DET determines that the detecting electrode E2 is in a noncontact state. When the detected voltage is lower than the threshold voltage, the voltage detector DET determines that the detecting electrode E2 is in a contact state. A touch detection can be thus performed.

2. First Embodiment (Example of Transistors Being Divided and Formed into Even Number of Pieces)

Constitution of Display Device 1

FIG. 4 shows a sectional structure of principal parts of a display device having a semiconductor device (display device 1 provided with a touch sensor) according to a first embodiment of the present disclosure. In this display device 1, a liquid crystal element is used as a display element, and a capacitance type touch sensor is formed by making a part of electrodes (common electrode 43 to be described later) originally provided to the liquid crystal element and a driving signal for display (common driving signal $V_{com}$ to be described later) respectively serve a double purpose. That is, the display device 1 has a display function and a touch sensor function.

As shown in FIG. 4, the display device 1 includes a pixel substrate 2, a counter substrate 4 disposed so as to be opposed to the pixel substrate 2, and a liquid crystal layer 6 inserted between the pixel substrate 2 and the counter substrate 4.

The pixel substrate 2 includes a TFT (thin film transistor) substrate 21 as a circuit substrate, a common electrode/sensor driving electrode 43 formed on the TFT substrate 21, and a plurality of pixel electrodes 22 arranged in the form of a matrix above the common electrode/sensor driving electrode 43 with an insulating layer 23 interposed therebetween. Formed on the TFT substrate 21 are a display driver (driving section to be described later) not shown in FIG. 4 for driving each of the pixel electrodes 22 and TFTs (thin film transistors) as well as wiring including signal lines (data lines 25 to be described later) for supplying image signals to the respective pixel electrodes 22 and gate lines (gate lines 26 to be described later) for driving the respective TFTs. A detecting circuit for performing touch detecting operation to be described later may also be formed on the TFT substrate 21.

The common electrode/sensor driving electrode 43 (hereinafter referred to simply as a "common electrode 43") is a common electrode common to each display pixel, and is used also as a driving electrode for the sensor forming a part of the touch sensor performing the touch detecting operation. The common electrode 43 corresponds to the driving electrode E1 in FIG. 1A. That is, the common driving signal $V_{com}$ of an alternating-current rectangular waveform is applied to the common electrode 43. This common driving signal $V_{com}$ defines the display voltage of each display pixel together with pixel voltage applied to the pixel electrodes 22, and is used also as a driving signal for the touch sensor. The common driving signal $V_{com}$ corresponds to the alternating-current rectangular wave $S_g$ supplied from the driving signal source $S_{ac}$ in FIG. 1B. That is, the common driving signal $V_{com}$ is polarity-inverted in each of predetermined cycles.

The counter substrate 4 includes a glass substrate 41, a color filter 42 formed on one surface of the glass substrate 41, and a sensor detecting electrode (touch detecting electrode) 44 formed on the color filter 42. In addition, a polarizer 45 is disposed on the other surface of the glass substrate 41.

The color filter 42 is formed by periodically arranging color filter layers of three colors, for example red (R), green (G), and blue (B). The three colors of R, G and B are associated as one set with each display pixel (pixel electrode 22). The sensor detecting electrode 44 forms a part of the touch sensor, and corresponds to the detecting electrode E2 in FIG. 1A.

The liquid crystal layer 6 modulates light passing through the liquid crystal layer 6 according to the state of an electric field. Liquid crystals in various modes such as a TN (Twisted Nematic) mode, a VA (Vertical Alignment) mode, and an ECB (Electrically Controlled Birefringence) mode, for example, are used for the liquid crystal layer 6. Alternatively, liquid crystals in transverse electric field modes such as an FFS (Fringe Field Switching) mode, an IPS (In-Plane Switching) mode, and the like may be used for the liquid crystal layer 6.

Incidentally, an alignment film is disposed between the liquid crystal layer 6 and the pixel substrate 2, and between the liquid crystal layer 6 and the counter substrate 4, and an incidence side polarizer is disposed on the lower surface side of the pixel substrate 2. However, the alignment films and the incidence side polarizer are not shown in FIG. 4.

Example of Detailed Configuration of Common Electrode 43 and Sensor Detecting Electrode 44

Figure 5:
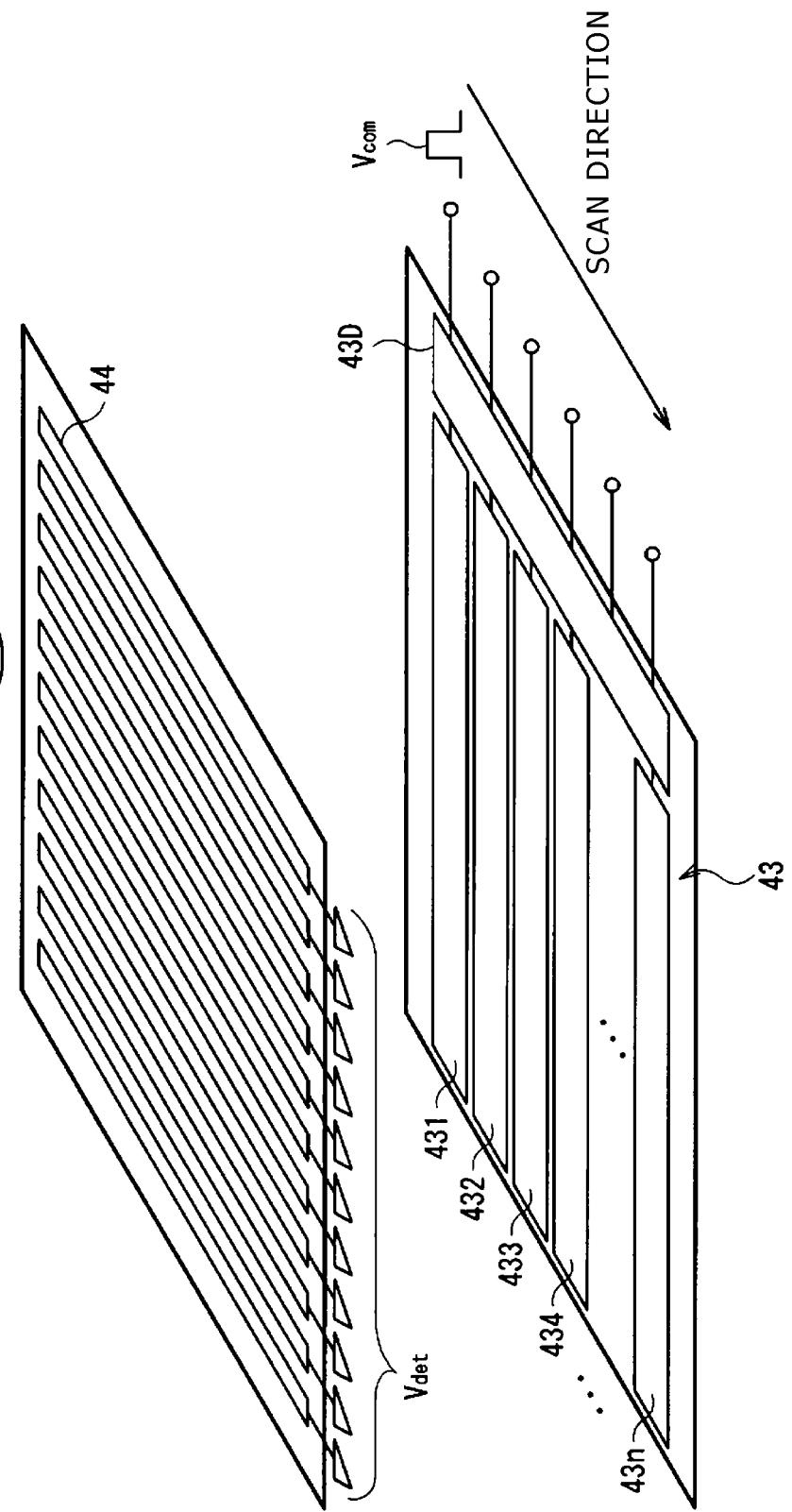
FIG. 5 is a perspective view of an example of one configuration of principal parts (a common electrode and a sensor detecting electrode) of the display device shown in FIG. 4.

FIG. 5 shows a configuration example of the common electrode 43 in the pixel substrate 2 and the sensor detecting electrode 44 in the counter substrate 4 in perspective. In this example, the common electrode 43 is divided into a plurality of stripe-shaped electrode patterns (composed of n (n is an integer of two or more) common electrodes 431 to 43n as an example in this case) extending in a horizontal direction in the drawing. Each of the electrode patterns is sequentially supplied with the common driving signal $V_{com}$ by a common electrode driver 43D so that line-sequential scanning driving is performed on a time division basis, as will be described later. On the other hand, the sensor detecting electrode 44 is composed of a plurality of stripe-shaped electrode patterns extending in a direction orthogonal to the extending direction of the electrode patterns of the common electrode 43. A detection signal $V_{det}$ is output from each of the electrode patterns of the sensor detecting electrode 44, and is input to a detecting circuit 8 to be described later.

Example of Configuration of Pixel Structure and Drivers

Figure 6:
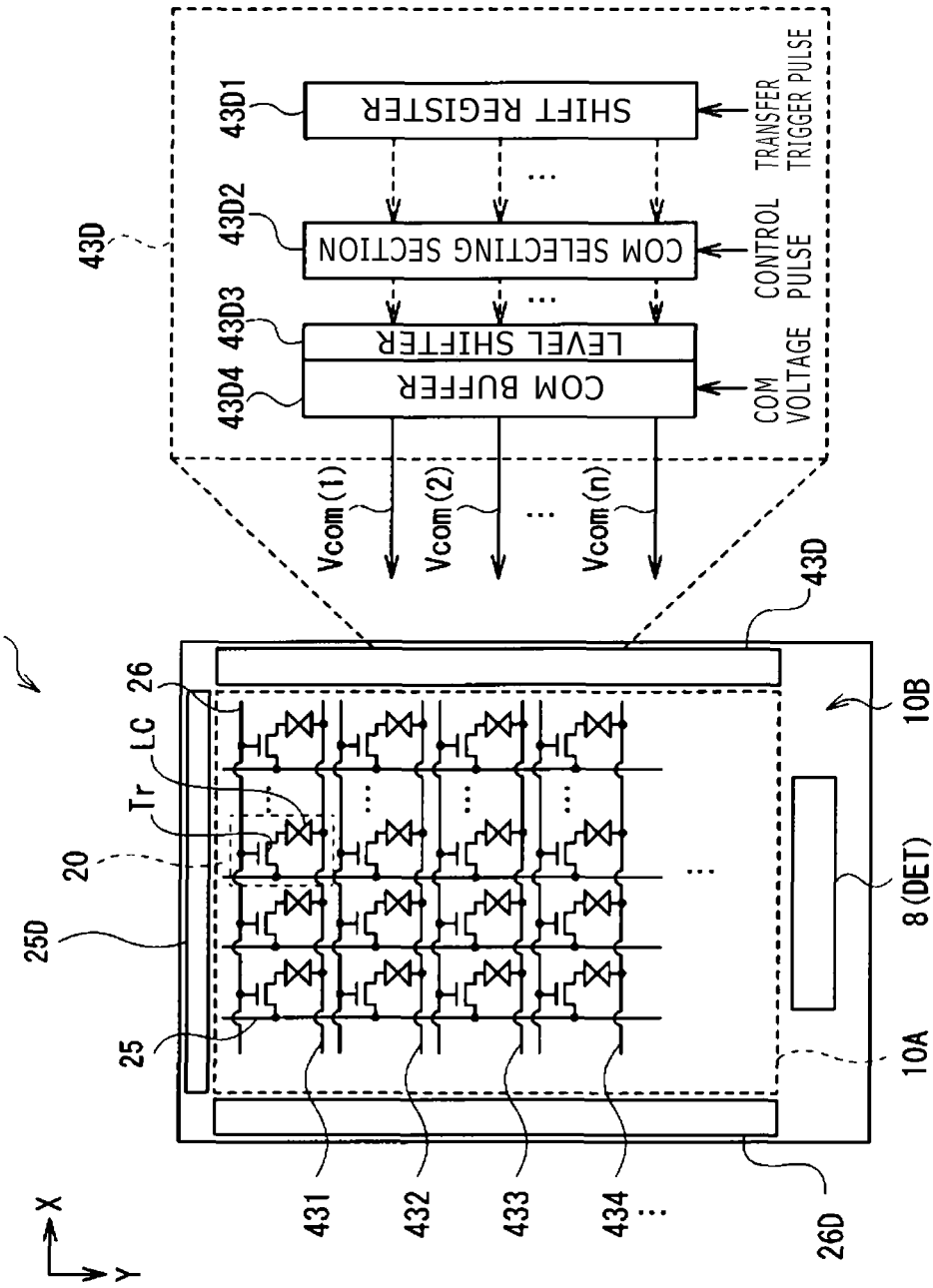
FIG. 6 is a block diagram showing an example of detailed configuration of a pixel structure and a driver in the display device shown in FIG. 4.
Figure 7:
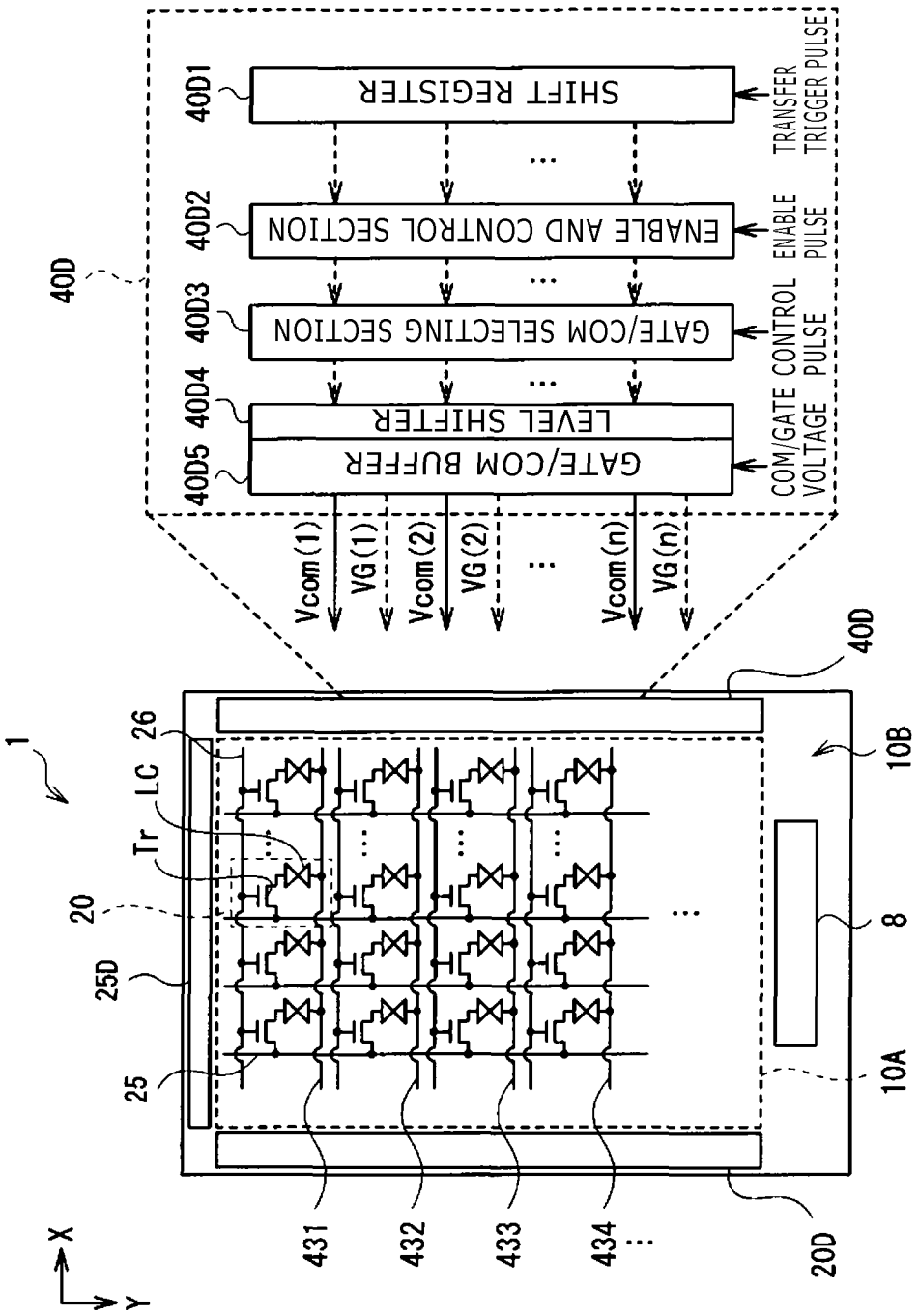
FIG. 7 is a block diagram showing another example of detailed configuration of the pixel structure and the driver in the display device shown in FIG. 4.

FIG. 6 and FIG. 7 show examples of configuration of a pixel structure and various drivers in the display device 1. In the display device 1, a plurality of display pixels 20 (pixels) including a TFT element Tr and a liquid crystal element LC are arranged in the form of a matrix within an effective display region 10A. That is, a display section having the plurality of display pixels 20 is disposed in the effective display region 10A. In addition, a display driver (driving section) including a semiconductor device to be described later and the detecting circuit 8 (DET) are arranged within a frame region (non-display region) 10B situated at outer edges (perimeter) of the effective display region 10A. Incidentally, in FIG. 6 and FIG. 7, an X-axis direction corresponds to a horizontal line direction (an H-direction and a second direction), and a Y-axis direction corresponds to a vertical line direction (a V-direction and a first direction). The same applies to other subsequent drawings.

Specifically, in the example shown in FIG. 6, a gate driver 26D (scanning line driving circuit), the common electrode driver 43D, and a data driver 25D (signal line driving circuit) as display drivers and the detecting circuit 8 are arranged within the frame region 10B. The gate driver 26D is a circuit for sequentially driving the plurality of display pixels 20 along the vertical line direction (the Y-axis direction and the first direction). The data driver 25D is a circuit for supplying a video signal to display pixels 20 as driving objects. The gate driver 26D, the common electrode driver 43D, and the data driver 25D in this case correspond to a concrete example of a "driving section" in the embodiment of the present disclosure. The data driver 25D in this case corresponds to a concrete example of a "horizontal driving circuit" in the embodiment of the present disclosure.

The display pixels 20 are connected with gate lines 26 connected to the gate driver 26D, signal lines (data lines) 25 connected to the data driver 25D, and the common electrodes 431 to 43n connected to the common electrode driver 43D. As described above, the common electrode driver 43D sequentially supplies the common electrodes 431 to 43n with the common driving signal $V_{com}$ ($V_{com}(1)$ to $V_{com}(n)$). The common electrode driver 43D includes for example a shift register 43D1, a COM selecting section 43D2, a level shifter 43D3, and a COM buffer 43D4.

The shift register 43D1 is a logic circuit for sequentially transferring an input pulse. Specifically, a transfer trigger pulse (start pulse) is input to the shift register 43D1, whereby clock transfer is started. In addition, when the start pulse is input a plurality of times within one frame period, transfer can be repeated each time the start pulse is input. Incidentally, the shift register 43D1 may be transfer logic circuits independent of each other to control the plurality of common electrodes 431 to 43n respectively. However, a control circuit scale is increased in that case. Thus, the transfer logic circuits are desirably shared by the gate driver and the common electrode driver as shown in FIG. 7 to be described later. Further, the shift register 43D1 is desirably a single transfer logic circuit irrespective of the number of pieces of the common electrode 43.

The COM selecting section 43D2 is a logic circuit for controlling whether to output the common driving signal $V_{com}$ to each display pixel 20 within the effective display region 10A. That is, the COM selecting section 43D2 controls the output of the common driving signal $V_{com}$ according to a position within the effective display region 10A or the like. Further, as will be described later in detail, by making a control pulse input to the COM selecting section 43D2 variable, it is possible for example to change the output position of the common driving signal $V_{com}$ arbitrarily for each horizontal line, or to change the output position after a plurality of horizontal periods.

The level shifter 43D3 is a circuit for shifting a control signal supplied from the COM selecting section 43D2 to a potential level sufficient to control the common driving signal $V_{com}$.

The COM buffer 43D4 is a final output logic circuit for sequentially supplying the common driving signal $V_{com}$ ($V_{com}(1)$ to $V_{com}(n)$). The COM buffer 43D4 includes a buffer circuit (FIG. 8) to be described later. Incidentally, the COM buffer 43D4 is supplied with a predetermined COM voltage used when generating the common driving signal $V_{com}$ (the potentials of power supply lines Lv1 and Lv2 to be described later, for example).

In the example shown in FIG. 7, on the other hand, a T/G and DC/DC converter 20D, a gate and common electrode driver 40D, and the data driver 25D as display drivers and the detecting circuit 8 are arranged within the frame region 10B. The T/G and DC/DC converter 20D functions as a T/G (timing generator) and a DC/DC (direct current-direct current) converter. The gate and common electrode driver 40D supplies a gate driving signal to each display pixel 20 via the gate lines 26, and sequentially supplies the common driving signal $V_{com}$($V_{com}(1)$ to $V_{com}(n)$) to the common electrodes 431 to 43n. The gate and common electrode driver 40D and the data driver 25D in this case correspond to a concrete example of a "driving section" in the embodiment of the present disclosure.

The display pixels 20 are connected with the gate lines 26 and the common electrodes 431 to 43n connected to the gate and common electrode driver 40D, and are connected with the data lines 25 connected to the data driver 25D. The gate and common electrode driver 40D includes for example a shift register 40D1, an enable and control section 40D2, a gate/COM selecting section 40D3, a level shifter 40D4, and a gate/COM buffer 40D5.

The shift register 40D1 has similar functions to those of the shift register 43D1 described earlier except that the shift register 40D1 is shared by a gate driver and a common electrode driver.

The enable and control section 40D2 generates a pulse for controlling the gate lines 26 by capturing an enable pulse using a clock pulse transferred from the shift register 40D1.

The gate/COM selecting section 40D3 is a logic circuit for controlling whether to output each of the common driving signal $V_{com}$ and a gate signal VG to each display pixel 20 within the effective display region 10A. That is, the gate/COM selecting section 40D3 controls the output of each of the common driving signal $V_{com}$ and the gate signal VG according to a position within the effective display region 10A or the like.

The level shifter 40D4 is a circuit for shifting a control signal supplied from the gate/COM selecting section 40D3 to a potential level sufficient to control each of the gate signal VG and the common driving signal $V_{com}$.

The gate/COM buffer 40D5 is a final output logic circuit for sequentially supplying each of the common driving signal $V_{com}$($V_{com}(1)$ to $V_{com}(n)$) and the gate signal VG (VG(1) to VG(n)). The gate/COM buffer 40D5 includes the buffer circuit (FIG. 8) to be described later. Incidentally, the gate/COM buffer 40D5 is supplied with a predetermined COM/gate voltage used when generating the common driving signal $V_{com}$ and the gate signal VG (the potentials of the power supply lines Lv1 and Lv2 to be described later, for example).

Example of Circuit Configuration of Buffer Circuit

Figure 8:
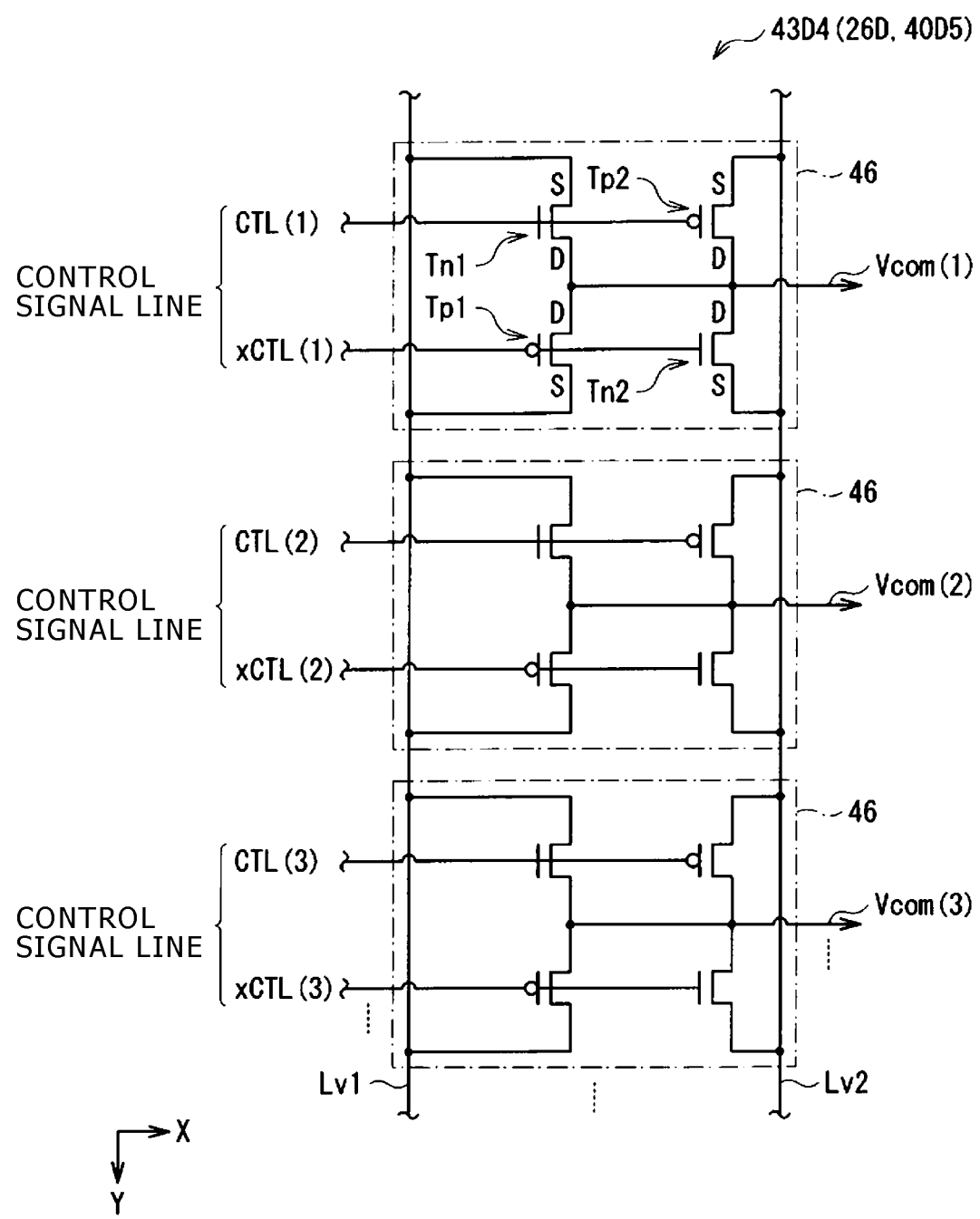
FIG. 8 is a circuit diagram showing an example of a buffer circuit (semiconductor device) shown in FIG. 6 or FIG. 7.

FIG. 8 shows an example of a circuit configuration of the buffer circuit (the COM buffer 43D4, the gate/COM buffer 40D5 or a buffer circuit not shown within the gate driver 26D) shown in FIG. 6 or FIG. 7. This buffer circuit corresponds to a concrete example of a "vertical driving circuit" and a "semiconductor device (semiconductor circuit)" in the embodiment of the present disclosure. However, for the convenience of description in the following, an example of a circuit configuration of the buffer circuit in the COM buffer 43D4 will be described.

The COM buffer 43D4 has a plurality of unit circuits 46 along the vertical line direction (Y-axis direction). Each of the unit circuits 46 is connected with a pair of control signal lines CTL and xCTL, one common driving signal (output signal line) $V_{com}$, and the pair of power supply lines Lv1 and Lv2. Specifically, the unit circuit 46 disposed at the top of FIG. 8 is connected with control signal lines CTL(1) and xCTL(1), an output signal line $V_{com}(1)$, and the power supply lines Lv1 and Lv2. Similarly, the unit circuit 46 disposed at the middle of FIG. 8 is connected with control signal lines CTL(2) and xCTL(2), an output signal line $V_{com}(2)$, and the power supply lines Lv1 and Lv2. The unit circuit 46 disposed at the bottom of FIG. 8 is connected with control signal lines CTL(3) and xCTL(3), an output signal line $V_{com}(3)$, and the power supply lines Lv1 and Lv2. Incidentally, a control signal line xCTL refers to a signal line supplied with a logically inverted signal with respect to a control signal supplied to a control signal line CTL.

In addition, each unit circuit 46 has a buffer circuit composed of two N-type transistors Tn1 and Tn2 and two P-type transistors Tp1 and Tp2. Specifically, the buffer circuit is formed by an inverter circuit composed of the transistors Tn1 and Tp1 in a first stage on an input side (on the side of the control signal line CTL) and an inverter circuit composed of the transistors Tn2 and Tp2 in a second stage on an output side (on the side of the output signal line $V_{com}$). More specifically, the gate of the transistor Tn1 is connected with the control signal line CTL(1), and the gate of the transistor Tp1 is connected with the control signal line xCTL(1). The sources of the transistors Tn1 and Tp1 are each connected with the power supply line Lv1. The drains of the transistors Tn1 and Tp1 are each connected with the output signal line $V_{com}(1)$. The above-described inverter circuit in the first stage is thereby formed. In addition, the gate of the transistor Tp2 is connected with the control signal line CTL(1), and the gate of the transistor Tn2 is connected with the control signal line xCTL(1). The sources of the transistors Tn2 and Tp2 are each connected with the power supply line Lv2. The drains of the transistors Tn2 and Tp2 are each connected with the output signal line $V_{com}(1)$. The above-described inverter circuit in the second stage is thereby formed. Incidentally, "S" and "D" shown in FIG. 8 respectively denote a source (source region) and a drain (drain region) in each transistor. The same applies to other subsequent drawings.

Figure 9:
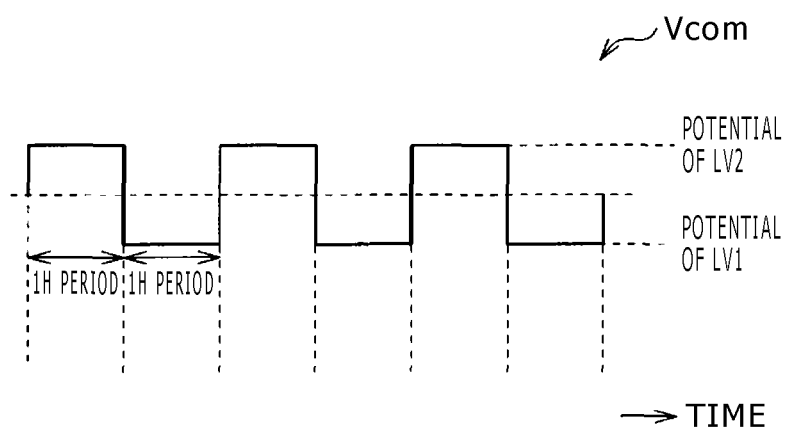
FIG. 9 is a timing waveform chart of an example of a common driving signal generated by the buffer circuit shown in FIG. 8.

The power supply lines Lv1 and Lv2 retain a predetermined COM voltage (a direct-current voltage or an alternating-current voltage) used when the common driving signal $V_{com}$ is generated. Thereby, as shown in FIG. 9, for example, the common driving signal $V_{com}$ output from the buffer circuit represents a pulse waveform composed of the potentials of the power supply lines Lv1 and Lv2. Thus, the plurality of unit circuits 46 in the buffer circuit sequentially operate along the Y-axis direction (the vertical line direction and the first direction) according to the control signals supplied from the control signal lines CTL and xCTL, respectively.

Example of Arrangement Configuration of Buffer Circuit

Figure 10:
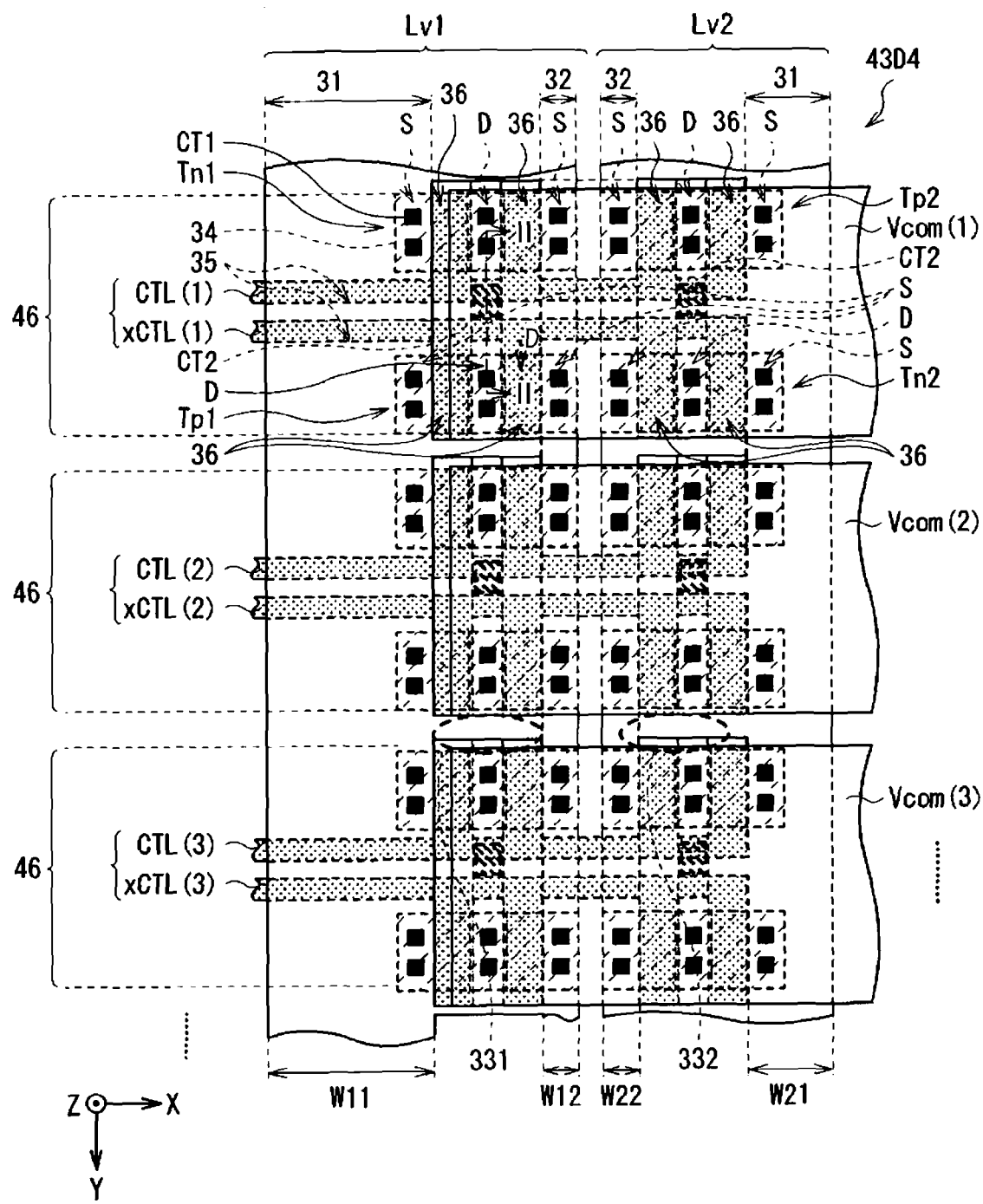
FIG. 10 is a schematic plan view of an example of arrangement configuration of the buffer circuit according to the first embodiment.
Figure 11:
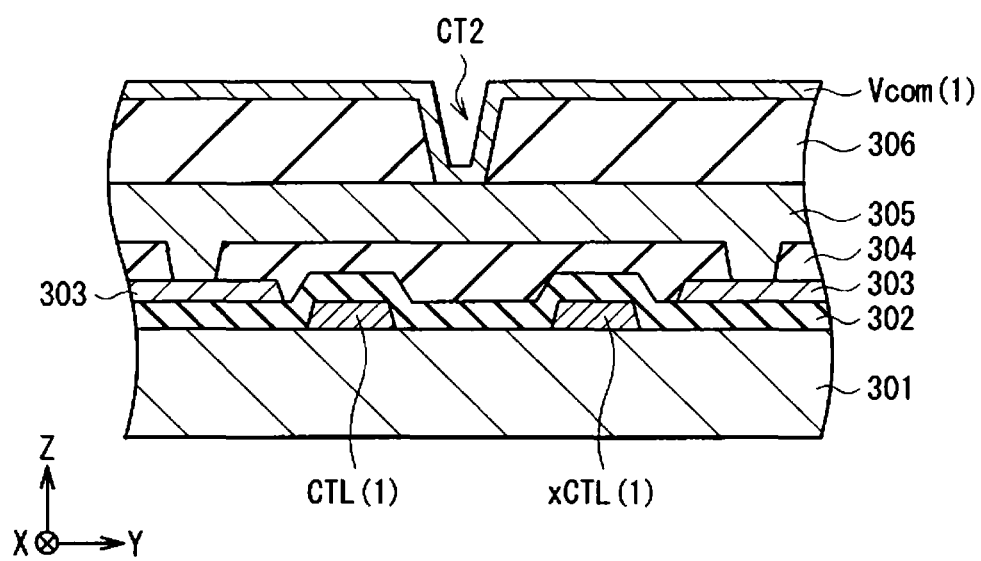
FIG. 11 is a schematic diagram showing an example of a sectional configuration taken along a line II-II shown in FIG. 10.

FIG. 10 shows an example of an arrangement configuration (an example of a layout configuration: an example of an X-Y planar configuration) of the buffer circuit in the COM buffer 43D4 or the like as shown in FIG. 8. FIG. 11 schematically shows an example of a sectional configuration (an example of a Y-Z sectional configuration) taken along a line II-II of FIG. 10.

In the buffer circuit according to the present embodiment, as shown in FIG. 10, the unit circuit 46 includes two power supply lines Lv1 and Lv2 (first wiring), two control signal lines CTL and xCTL (second wiring), one output signal line $V_{com}$ (third wiring), and four transistors Tn1, Tn2, Tp1 and Tp2. A plurality of such unit circuits 46 are provided along the Y-axis direction (the vertical line direction and the first direction). In addition, the power supply lines Lv1 and Lv2, the control signal lines CTL and xCTL, and the output signal line $V_{com}$ are formed in respective layers different from each other (see FIG. 11 to be described later). Specifically, in this case, the control signal lines CTL and xCTL, the power supply lines Lv1 and Lv2, and the output signal line $V_{com}$ are formed in this order in respective different layers along the normal direction of the Z-axis from the side of a substrate 301 to be described later.

The power supply lines Lv1 and Lv2 each extend along the Y-axis direction (the vertical line direction and the first direction). In addition, the power supply lines Lv1 and Lv2 each have a main wiring section 31 and a bifurcation wiring section 32 arranged so as to be separated from each other. The main wiring section 31 is wiring having a relatively large wiring width. The main wiring section 31 of the power supply line Lv1 has a wiring width W11. The main wiring section 31 of the power supply line Lv2 has a wiring width W21. The bifurcation wiring section 32 is wiring having a relatively small wiring width. The bifurcation wiring section 32 of the power supply line Lv1 has a wiring width W12 (≤W11). The bifurcation wiring section 32 of the power supply line Lv2 has a wiring width W22 (≤W21). In this case, the main wiring section 31 and the bifurcation wiring section 32 of the power supply line Lv1 and the bifurcation wiring section 32 and the main wiring section 31 of the power supply line Lv2 are arranged in this order along the normal direction of an X-axis (toward the side of the effective display region 10A). In addition, the power supply line Lv1 has a connecting part 331 for electrically connecting the main wiring section 31 and the bifurcation wiring section 32 of the power supply line Lv1 to each other within a gap region between the main wiring section 31 and the bifurcation wiring section 32. Similarly, the power supply line Lv2 has a connecting part 332 for electrically connecting the main wiring section 31 and the bifurcation wiring section 32 of the power supply line Lv2 to each other within a gap region between the main wiring section 31 and the bifurcation wiring section 32. Incidentally, these connecting parts 331 and 332 are provided in the region corresponding to the gap of each unit circuit 46 (provided for each unit circuit 46) in this case, but are not limited to this. The connecting parts 331 and 332 may be provided at a ratio of one connecting part 331 or 332 to a plurality of unit circuits 46.

The control signal lines CTL and xCTL each have a trunk wiring section 35 and a branch wiring section 36. The trunk wiring section 35 is wiring extending along the X-axis direction (the horizontal line direction and the second direction). The branch wiring section 36 extends along the Y-axis direction (the vertical line direction and the first direction) within a gap region between the main wiring section 31 and the bifurcation wiring section 32 described above so as to branch from the trunk wiring section 35. That is, the trunk wiring section 35 and the branch wiring section 36 are electrically connected to each other. A plurality of such branch wiring sections 36 are arranged so as to be separated from each other within the gap region between the main wiring section 31 and the bifurcation wiring section 32 of the power supply line Lv1, and a plurality of such branch wiring sections 36 are arranged so as to be separated from each other within the gap region between the main wiring section 31 and the bifurcation wiring section 32 of the power supply line Lv2. Specifically, an even number of branch wiring sections 36 (two branch wiring sections 36 in this case) are arranged so as to be separated from each other within the gap region between the main wiring section 31 and the bifurcation wiring section 32 of the power supply line Lv1. Similarly, an even number of branch wiring sections 36 (two branch wiring sections 36 in this case) are arranged so as to be separated from each other within the gap region between the main wiring section 31 and the bifurcation wiring section 32 of the power supply line Lv2.

In each unit circuit 46, the transistors Tn1 and Tp1 are each formed on the side of the power supply line Lv1, and the transistors Tn2 and Tp2 are each formed on the side of the power supply line Lv2. In addition, the transistors Tn1 and Tp2 are each formed on the side of the control signal line CTL, and the transistors Tp1 and Tn2 are each formed on the side of the control signal line xCTL. The plurality of branch wiring sections 36 described above individually function as a gate electrode in these transistors Tn1, Tn2, Tp1 and Tp2. Specifically, in the transistor Tn1, two branch wiring sections 36 on the side of the power supply line Lv1 in the control signal line CTL each function as a gate electrode, and in the transistor Tp1, two branch wiring sections 36 on the side of the power supply line Lv1 in the control signal line xCTL each function as a gate electrode. Similarly, in the transistor Tp2, two branch wiring sections 36 on the side of the power supply line Lv2 in the control signal line CTL each function as a gate electrode, and in the transistor Tn2, two branch wiring sections 36 on the side of the power supply line Lv2 in the control signal line xCTL each function as a gate electrode. In addition, each of the transistors Tn1, Tn2, Tp1 and Tp2 has a source region S formed within the main wiring section 31 and the bifurcation wiring section 32, and has a drain region D formed between the plurality of branch wiring sections 36. Specifically, the transistor Tn1 has a source region S formed within each of the main wiring section 31 and the bifurcation wiring section 32 of the power supply line Lv1, and has a drain region D formed between the two branch wiring sections 36 on the side of the power supply line Lv1 in the control signal line CTL. Similarly, the transistor Tp1 has a source region S formed within each of the main wiring section 31 and the bifurcation wiring section 32 of the power supply line Lv1, and has a drain region D formed between the two branch wiring sections 36 on the side of the power supply line Lv1 in the control signal line xCTL. The transistor Tp2 has a source region S formed within each of the main wiring section 31 and the bifurcation wiring section 32 of the power supply line Lv2, and has a drain region D formed between the two branch wiring sections 36 on the side of the power supply line Lv2 in the control signal line CTL. The transistor Tn2 has a source region S formed within each of the main wiring section 31 and the bifurcation wiring section 32 of the power supply line Lv2, and has a drain region D formed between the two branch wiring sections 36 on the side of the power supply line Lv2 in the control signal line xCTL. Incidentally, regions hatched in FIG. 10 represent active regions 34 in a semiconductor layer. The same applies to other subsequent drawings. In addition, a contact CT1 is formed in each of the active regions 34.

With such a constitution, each of the transistors Tn1, Tn2, Tp1 and Tp2 is arranged along the Y-axis direction (the vertical line direction and the first direction) (each gate electrode extends along the Y-axis direction). In addition, as described above, each of the transistors Tn1, Tn2, Tp1 and Tp2 has a plurality of gate electrodes formed by the branch wiring sections 36. Thereby, each of the transistors Tn1, Tn2, Tp1 and Tp2 is divided and formed into a plurality of pieces along the X-axis direction (the horizontal line direction and the second direction). Specifically, in the present embodiment, each of the transistors Tn1, Tn2, Tp1 and Tp2 is divided and formed into an even number of pieces (two pieces in this case) along the X-axis direction. Letting M be the number of divisions of each of the transistors Tn1, Tn2, Tp1 and Tp2, letting W1 be a total wiring width of the main wiring section 31 and the bifurcation wiring section 32 of the power supply line Lv1, and letting W2 be a total wiring width of the main wiring section 31 and the bifurcation wiring section 32 of the power supply line Lv2, the following Equation (1) and Equation (2) hold. Incidentally, in these equations, M'=(M/2) (a fractional part is discarded).

$$W11+(W12 \times M')=W1 \quad (1)$$

$$W21+(W22 \times M')=W2 \quad (2)$$

In addition, in the present embodiment, each of the transistors Tn1, Tn2, Tp1 and Tp2 in the buffer circuit (vertical driving circuit) and each transistor (not shown) in the data driver 25D (horizontal driving circuit) are both arranged along the Y-axis direction (the vertical line direction and the first direction). In other words, the gate electrodes of the respective transistors are each arranged so as to extend in the Y-axis direction. Thereby, as will be described later in detail, a laser annealing process for an amorphous semiconductor layer (for example an amorphous silicon (a-Si) layer) is facilitated when each of these transistors includes a polycrystalline semiconductor layer (for example a polycrystalline silicon (p-Si) layer).

The output signal line $V_{com}$ extends along the X-axis direction (the horizontal line direction and the second direction). The output signal line $V_{com}$ is electrically connected to the drain region D in each of the transistors Tn1, Tn2, Tp1 and Tp2 via a contact CT2 (see FIG. 11). In the example of the sectional configuration shown in FIG. 11, the control signal lines CTL(1) and xCTL(1) as gate electrodes, a gate insulating film 302, a semiconductor layer 303, an interlayer insulating film 304, a drain electrode 305, the contact CT2, a planarizing film 306, and the wiring layer of the output signal line $V_{com}$(1) are formed so as to be laminated in this order on a substrate 301.

Example of Circuit Configuration of Detecting Circuit 8

Figure 12:
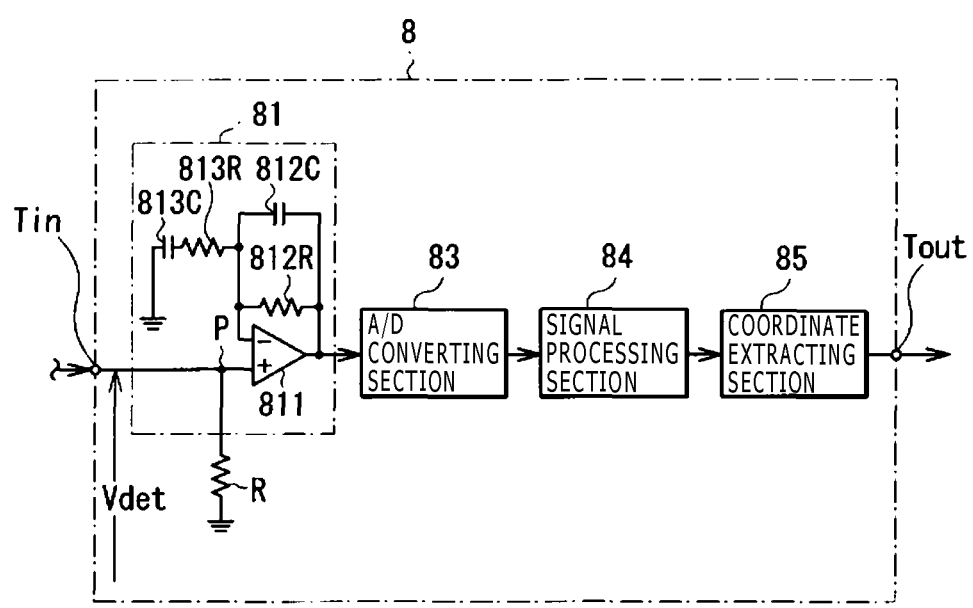
FIG. 12 is a circuit diagram showing an example of a detecting circuit in the display device shown in FIG. 4.

FIG. 12 shows an example of a circuit configuration of the detecting circuit 8, shown in FIG. 6 and FIG. 7, performing touch detecting operation. The detecting circuit 8 (voltage detector DET) includes an amplifying section 81, an A/D (analog-to-digital) converting section 83, a signal processing section 84, a coordinate extracting section 85, and the above-described resistor R.

The amplifying section 81 is a part for amplifying a detection signal $V_{det}$ input from an input terminal $T_{in}$. The amplifying section 81 includes an operational amplifier 811 for signal amplification, two resistors 812R and 813R, and two capacitors 812C and 813C. The operational amplifier 811 has a positive input terminal (+) connected to the input terminal $T_{in}$, and has an output terminal connected to an input terminal of the A/D converting section 83 to be described later. One terminal of the resistor 812R and one terminal of the capacitor 812C are both connected to the output terminal of the operational amplifier 811. The other terminal of the resistor 812R and the other terminal of the capacitor 812C are both connected to a negative input terminal (−) of the operational amplifier 811. One terminal of the resistor 813R is connected to the other terminal of the resistor 812R and the other terminal of the capacitor 812C. The other terminal of the resistor 813R is connected to ground via the capacitor 813C. Thereby, the resistor 812R and the capacitor 812C function as a low-pass filter (LPF) for cutting off high frequencies and passing low frequencies, and the resistor 813R and the capacitor 813C function as a high-pass filter (HPF) for passing high frequencies.

The resistor R is disposed between a connecting point P on the side of the positive input terminal (+) of the operational amplifier 811 and the ground. This resistor R is to avoid a floating state of the sensor detecting electrode 44 and maintain a stable state. Thereby, the signal value of the detection signal $V_{det}$ is prevented from becoming unsteady and varying in the detecting circuit 8, and another advantage of being able to allow static electricity to escape via the resistor R to the ground can be obtained.

The A/D converting section 83 is a part for converting the analog detection signal $V_{det}$ amplified in the amplifying section 81 into a digital detection signal. The A/D converting section 83 includes a comparator not shown in FIG. 12. The comparator compares the potential of the input detection signal with the potential of a predetermined threshold voltage $V_{th}$ (see FIGS. 3A and 3B).

The signal processing section 84 subjects the digital detection signal output from the A/D converting section 83 to predetermined signal processing (signal processing such for example as digital noise removal processing and processing for converting frequency information into positional information).

The coordinate extracting section 85 obtains a detection result on the basis of the detection signal output from the signal processing section 84, and outputs the detection result from an output terminal $T_{out}$. This detection result includes information indicating whether the touch sensor is touched and the positional coordinates of a touched part when the touch sensor is touched.

Action and Effect of Display Device 1

1. Basic Operation

In the display device 1, the display driver (common electrode driver 43D or the like) on the pixel substrate 2 supplies the common driving signal $V_{com}$ to each of the electrode patterns (common electrodes 431 to 43n) of the common electrode 43 on a line-sequential basis. The display driver also supplies pixel signals (image signals) to the pixel electrodes 22 via the signal lines 25, and controls the switching of the TFTs (TFT elements Tr) for the respective pixel electrodes via the gate lines 26 on a line-sequential basis in synchronism with the supply of the pixel signals. Thereby, electric fields, in a vertical direction (direction perpendicular to the substrate), determined by the common driving signal $V_{com}$ and the respective image signals are applied to the liquid crystal layer 6 in the respective display pixels 20, so that a liquid crystal state is modulated.

Meanwhile, on the side of the counter substrate 4, a capacitance element C1 is formed at each of intersection parts of the respective electrode patterns of the common electrode 43 and the respective electrode patterns of the sensor detecting electrode 44. In this case, when the common driving signal $V_{com}$ is sequentially applied to the electrode patterns of the common electrode 43 on a time division basis as indicated by an arrow (scan direction) in FIG. 5, for example, the following occurs. That is, each of capacitance elements C1 in one row formed at intersection parts of the applied electrode pattern of the common electrode 43 and the electrode patterns of the sensor detecting electrode 44 is charged and discharged. As a result, detection signals $V_{det}$ of magnitudes corresponding to the capacitance value of the capacitance elements C1 are output from the respective electrode patterns of the sensor detecting electrode 44. In a state of no finger of a user touching the surface of the counter substrate 4, the detection signals $V_{det}$ have a substantially fixed magnitude. The row of capacitance elements C1 as charging and discharging objects moves on a line-sequential basis with the scanning of the common driving signal $V_{com}$.

When a finger of a user touches some position of the surface of the counter substrate 4, a capacitance element C2 formed by the finger is added to the capacitance element C1 originally formed at the touched position. As a result, the value of the detection signal $V_{det}$ at a point when the touched position is scanned (that is, when the common driving signal $V_{com}$ is applied to the electrode pattern corresponding to the touched position among the electrode patterns of the common electrode 43) is smaller than at other positions. The detecting circuit 8 compares the detection signal $V_{det}$ with the threshold voltage $V_{th}$. When the detection signal $V_{det}$ is lower than the threshold voltage $V_{th}$, the detecting circuit 8 determines that the position is a touched position. This touched position can be calculated from the timing of application of the common driving signal $V_{com}$ and the timing of detection of the detection signal $V_{det}$ lower than the threshold voltage $V_{th}$.

Thus, in the display device 1 provided with the touch sensor, the common electrode 43 originally provided for the liquid crystal display element is shared as one of the pair of electrodes for the touch sensor including the driving electrode and the detecting electrode. In addition, the common driving signal $V_{com}$ as a driving signal for display is shared as a driving signal for the touch sensor. Thus, only the sensor detecting electrode 44 needs to be newly provided in the capacitance type touch sensor, and a driving signal for the touch sensor does not need to be newly prepared. Therefore the configuration is simple.

In addition, a display device provided with a touch sensor in the past accurately measures the magnitude of a current flowing in the sensor, and determines a touched position by analog operation on the basis of the measured value. On the other hand, it suffices for the display device 1 according to the present embodiment only to sense digitally the presence or absence of a relative change in current (potential change) corresponding to the presence or absence of a touch. Therefore detection accuracy can be enhanced by a simple detecting circuit configuration. In addition, a capacitance is formed between the common electrode 43 originally provided for the application of the common driving signal $V_{com}$ and the newly provided sensor detecting electrode 44, and touch detection is performed by using a change in the capacitance caused by the touch of a finger of a user. Thus, the display device 1 is adaptable for applications in mobile devices where the potential of a user is often indefinite.

Further, the sensor detecting electrode 44 is divided into a plurality of electrode patterns, and each of the electrode patterns is driven on a time division basis. Therefore a touched position can also be detected.

2. Action of Buffer Circuit

The action of the buffer circuit in the above-described COM buffer 43D4 or the like will next be described in detail while compared with a comparative example.

2-1. Comparative Example

Figure 13:
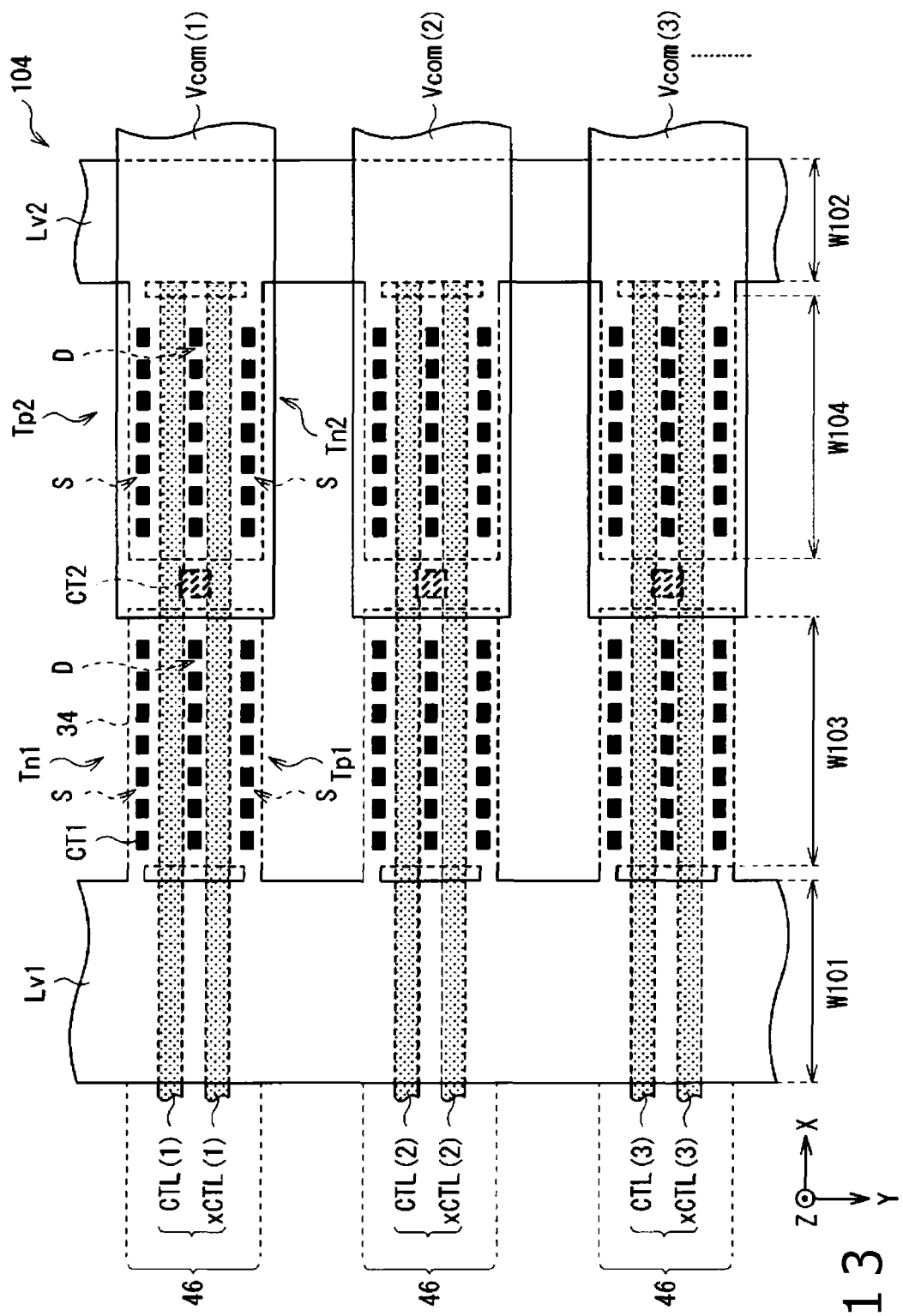
FIG. 13 is a schematic plan view of an example of arrangement configuration of a buffer circuit according to a comparative example.

FIG. 13 shows an example of an arrangement configuration (an example of a layout configuration: an example of an X-Y planar configuration) of a buffer circuit (buffer circuit 104) according to a comparative example.

In the buffer circuit 104 according to the comparative example, as in the buffer circuit according to the present embodiment, a unit circuit 46 is formed by two power supply lines Lv1 and Lv2, two control signal lines CTL and xCTL, one output signal line $V_{com}$, and four transistors Tn1, Tn2, Tp1 and Tp2. In addition, a plurality of unit circuits 46 are provided along the Y-axis direction.

However, in the buffer circuit 104, unlike the buffer circuit according to the present embodiment, the power supply lines Lv1 and Lv2 are respectively formed of a single piece of wiring (without the wiring branching into the main wiring section 31 and the bifurcation wiring section 32). In addition, the control signal lines CTL and xCTL each extend only along the X-axis direction (include only the trunk wiring section 35), and do not include the wiring extending in the Y-axis direction (wiring corresponding to the branch wiring section 36). For these reasons, in the buffer circuit 104, each of the transistors Tn1, Tn2, Tp1 and Tp2 is disposed along the X-axis direction (each gate electrode extends along the X-axis direction) unlike the buffer circuit according to the present embodiment. In addition, each of the transistors Tn1, Tn2, Tp1 and Tp2 is provided with only one gate electrode formed by the control signal line CTL or xCTL. Thus, unlike the present embodiment, each of the transistors Tn1, Tn2, Tp1 and Tp2 is not formed in a divided manner.

When circuit characteristics (operating characteristics) of the buffer circuit 104 are to be ensured (maintained), the wiring widths W101 and W102 of the power supply lines Lv1 and Lv2 need to be set somewhat large. However, there has recently been a tendency to desire that display devices have a narrower frame (the area of the frame region 10B be reduced). When the wiring widths of the power supply lines Lv1 and Lv2 are to be accordingly reduced, the circuit characteristics cannot be ensured as described above (circuit characteristics are degraded). As a result, display image quality is lowered (for example a flicker phenomenon occurs). On the other hand, when the circuit characteristics are to be ensured, the wiring widths W101 and W102 of the power supply lines Lv1 and Lv2 and the gate widths W103 and W104 of the respective transistors Tn1, Tn2, Tp1 and Tp2 need to be increased because a wiring load is increased as the size and the number of pixels of the display section are increased. That is, the arrangement configuration (layout configuration) of the buffer circuit 104 invites an increase in circuit area, and may render it impossible to make provisions for a narrower frame. It is thus difficult to make provisions for space saving (area saving) while preventing degradation in characteristics in the buffer circuit 104 according to the comparative example.

2-2. Present Embodiment

On the other hand, the buffer circuit according to the present embodiment is arranged as shown in FIG. 10 and FIG. 11. Specifically, the power supply lines Lv1 and Lv2 extending along the Y-axis direction include a main wiring section 31 and a bifurcation wiring section 32, and the source regions S of the respective transistors Tn1, Tn2, Tp1 and Tp2 are formed within each of the main wiring sections 31 and the bifurcation wiring sections 32 of the power supply lines Lv1 and Lv2. Thereby, in the power supply lines Lv1 and Lv2, the source regions S of the transistors are linearly connected to each other along the Y-axis direction.

In addition, the control signal lines CTL and xCTL include the trunk wiring section 35 extending along the X-axis direction and the plurality of branch wiring sections 36 extending along the Y-axis direction. The drain regions D of the respective transistors Tn1, Tn2, Tp1 and Tp2 are formed between the plurality of branch wiring sections 36.

Further, the output signal line $V_{com}$ extending along the X-axis direction is electrically connected to the drain regions D of the respective transistors Tn1, Tn2, Tp1 and Tp2 via the contacts CT2.

Each of the transistors Tn1, Tn2, Tp1 and Tp2 is divided and formed into a plurality of pieces (an even number of pieces in this case) along the X-axis direction, and the plurality of branch wiring sections 36 individually function as a gate electrode in each of the thus-divided transistors Tn1, Tn2, Tp1 and Tp2.

Thus, in the present embodiment, each of the transistors Tn1, Tn2, Tp1 and Tp2 whose gate electrodes extend along the Y-axis direction (are arranged along the Y-axis direction) is divided and formed into a plurality of pieces (an even number of pieces in this case) along the X-axis direction. In addition, the main wiring sections 31 and the bifurcation wiring sections 32 arranged so as to be separated from each other respectively include the source regions of the transistors Tn1, Tn2, Tp1 and Tp2. Thus, the efficiency of arrangement in the X-axis direction of the buffer circuit as a whole is improved (arrangement width along the X-axis direction is reduced) while the wiring widths W1 and W2 (total values of the wiring widths of the main wiring sections 31 and the bifurcation wiring sections 32) of the power supply lines Lv1 and Lv2 described above are secured so as to be equal to those of the above comparative example (W1=W101 and W2=W102).

Thus, in the present embodiment, because the power supply lines Lv1 and Lv2, the control signal lines CTL and xCTL, the output signal line $V_{com}$, and the transistors Tn1, Tn2, Tp1 and Tp2 are arranged as described above, the efficiency of arrangement in the X-axis direction of the buffer circuit as a whole can be improved while the wiring widths W1 and W2 of the power supply lines Lv1 and Lv2 are secured. It is consequently possible to achieve space saving (area saving) while suppressing degradation in characteristics (for example degradation in display image quality). That is, it is possible to achieve both of a narrower frame and higher image quality. Incidentally, it can be said that this exerts greater effect (greater advantage) as the number of the display pixels 20 within the effective display region 10A is increased (as the pitch of the display pixels 20 is reduced).

In addition, when each of the transistors Tn1, Tn2, Tp1 and Tp2 in the buffer circuit and each transistor in the data driver 25D are both arranged along the Y-axis direction, the following effects can also be obtained. When each of these transistors includes a polycrystalline semiconductor layer, a laser annealing process for an amorphous semiconductor layer can be facilitated, and a manufacturing process can be simplified. Specifically, because the transistors in the respective driving circuits are arranged in the same direction (common direction), it suffices to perform laser annealing in a single annealing direction (irradiation direction of laser light), so that the laser annealing process is simplified. In addition, because of the same annealing direction, the polycrystalline semiconductor layers in the respective transistors can be made homogeneous. Therefore display image quality can be improved also from this respect.

3. Second Embodiment (Example of Transistors Being Divided and Formed into Odd Number of Pieces)

A second embodiment of the present disclosure will next be described. Incidentally, the same parts as in the foregoing first embodiment are identified by the same reference symbols, and description thereof will be omitted as appropriate.

Figure 14:
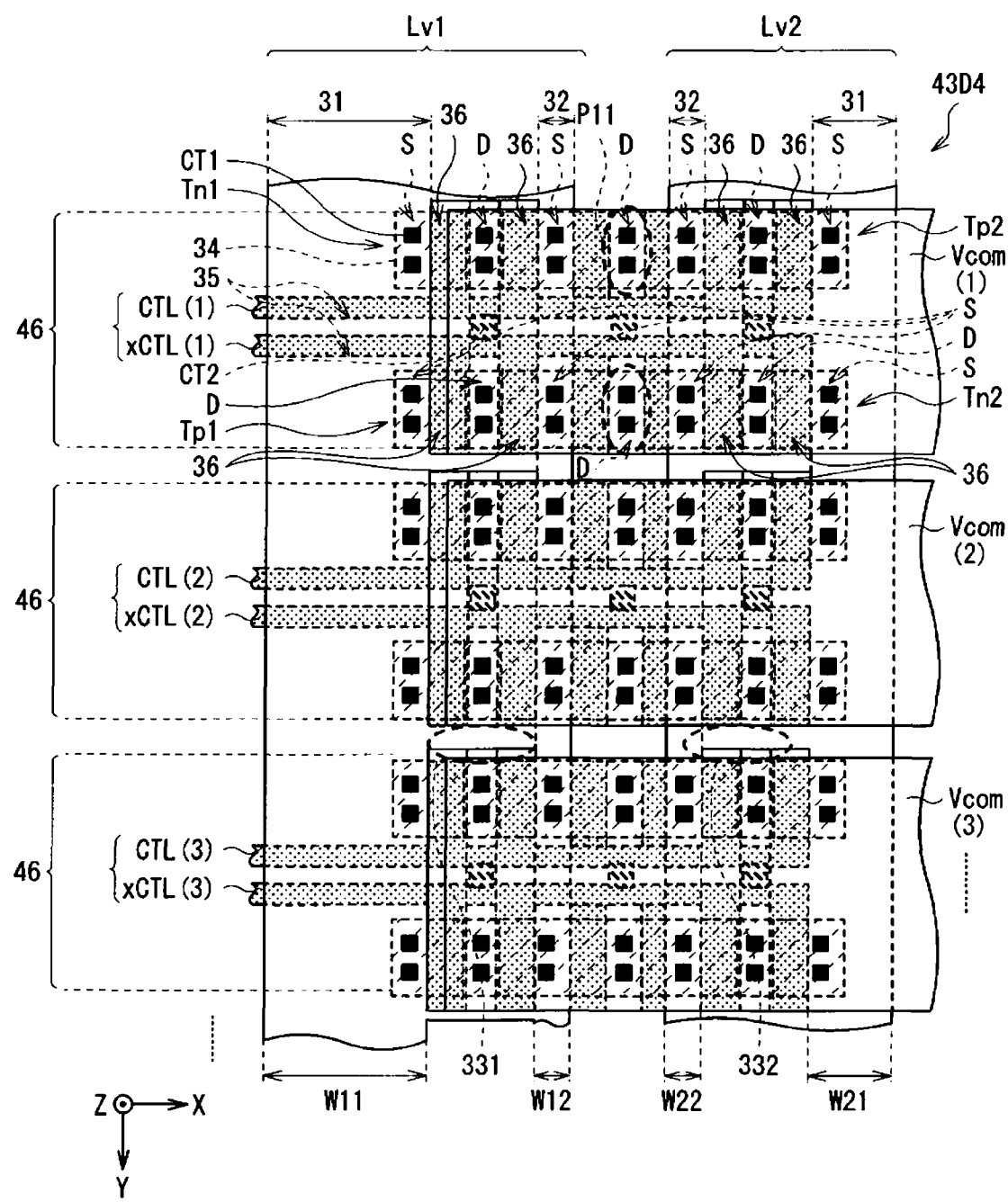
FIG. 14 is a schematic plan view of an example of arrangement configuration of a buffer circuit according to a second embodiment.

FIG. 14 shows an example of an arrangement configuration (an example of a layout configuration: an example of an X-Y planar configuration) of a buffer circuit (buffer circuit in the COM buffer 43D4 or the like) according to the present embodiment. In the present embodiment, unlike the first embodiment, each of the transistors Tn1, Tn2, Tp1 and Tp2 is divided and formed into an odd number of pieces.

Specifically, also in the buffer circuit according to the present embodiment, as in the first embodiment, each of the transistors Tn1, Tn2, Tp1 and Tp2 is arranged along the Y-axis direction (gate electrodes of the respective transistors extend along the Y-axis direction). In addition, each of the transistors Tn1, Tn2, Tp1 and Tp2 has the plurality of gate electrodes formed by the branch wiring sections 36. Each of the transistors Tn1, Tn2, Tp1 and Tp2 is thereby divided and formed into a plurality of pieces along the X-axis direction.

However, in the present embodiment, unlike the first embodiment, each of the transistors Tn1, Tn2, Tp1 and Tp2 is divided and formed into an odd number of pieces (three pieces in this case) along the X-axis direction. Letting N be the number of divisions of each of the transistors Tn1, Tn2, Tp1 and Tp2, letting W1 be a total wiring width of the main wiring section 31 and the bifurcation wiring section 32 of the power supply line Lv1, and letting W2 be a total wiring width of the main wiring section 31 and the bifurcation wiring section 32 of the power supply line Lv2, the following Equation (3) and Equation (4) hold. Incidentally, in these equations, N'={(N−1)/2} (a fractional part is discarded).

$$W11+(W12 \times N')=W1 \quad (3)$$

$$W21+(W22 \times N')=W2 \quad (4)$$

The buffer circuit formed of such a constitution according to the present embodiment can also provide similar effects by similar action to those of the first embodiment. That is, it is possible to achieve space saving while suppressing degradation in characteristics, for example.

In addition, in the present embodiment, in particular, as indicated by a reference symbol P11 in FIG. 14, the drain regions D of the transistors Tn1 and Tp2 can be formed by a common drain region (can be superposed on each other) between the power supply lines Lv1 and Lv2, and the drain regions D of the transistors Tp1 and Tn2 can be formed by a common drain region (can be superposed on each other) between the power supply lines Lv1 and Lv2. Therefore, as compared with the first embodiment (case where transistors are divided and formed into an even number of pieces), a circuit area along the X-axis direction can be further reduced, and an even narrower frame can be realized.

4. Modification Examples Common to First and Second Embodiments

Examples of modification (a first modification example and a second modification example) common to the foregoing first and second embodiments will next be described. Incidentally, the same parts as in these embodiments are identified by the same reference symbols, and description thereof will be omitted as appropriate.

First Modification Example (Example of Providing Through Holes in Parts of Wiring of Power Supply Lines)

Figure 15:
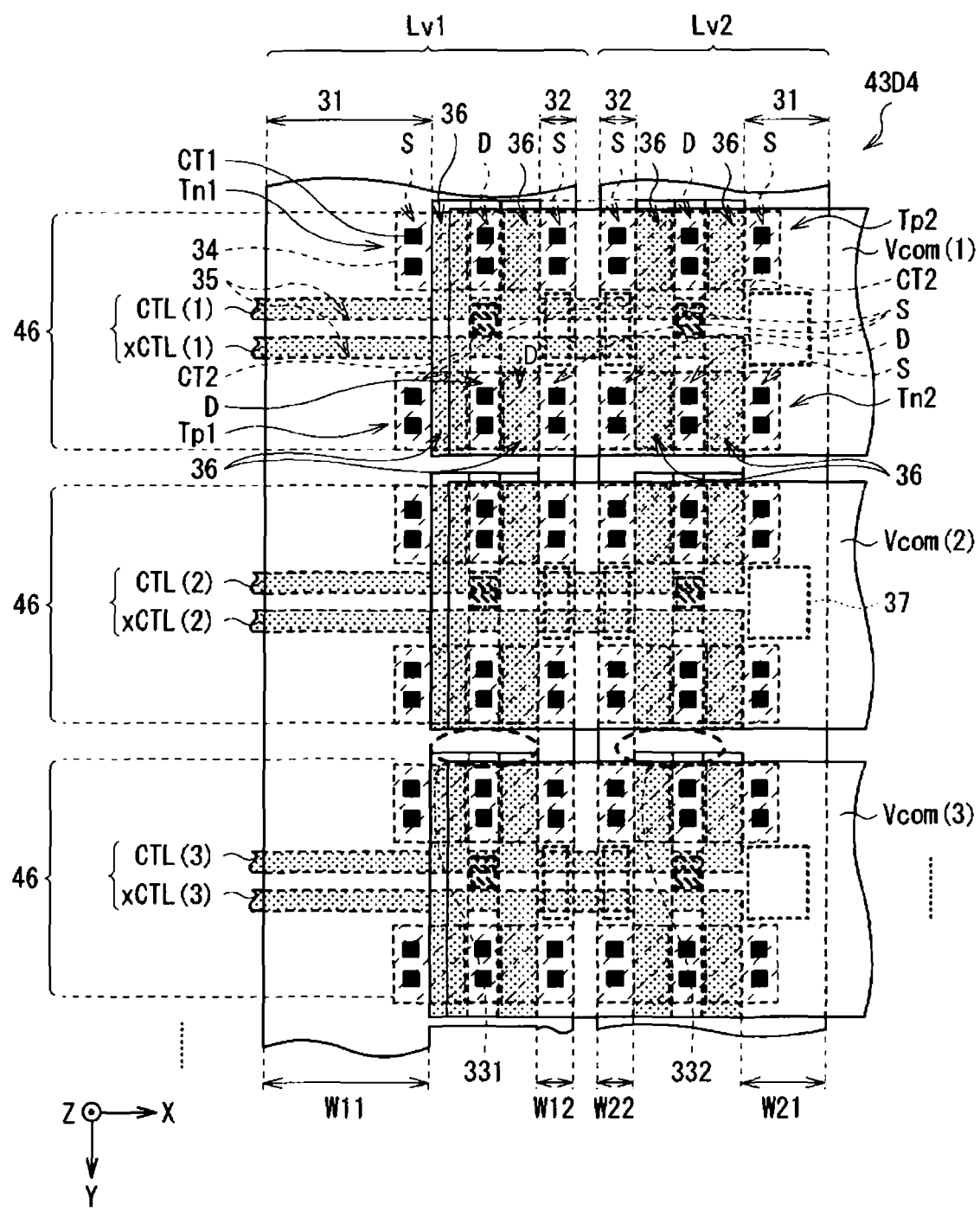
FIG. 15 is a schematic plan view of an example of arrangement configuration of a buffer circuit according to a first modification example.
Figure 16:
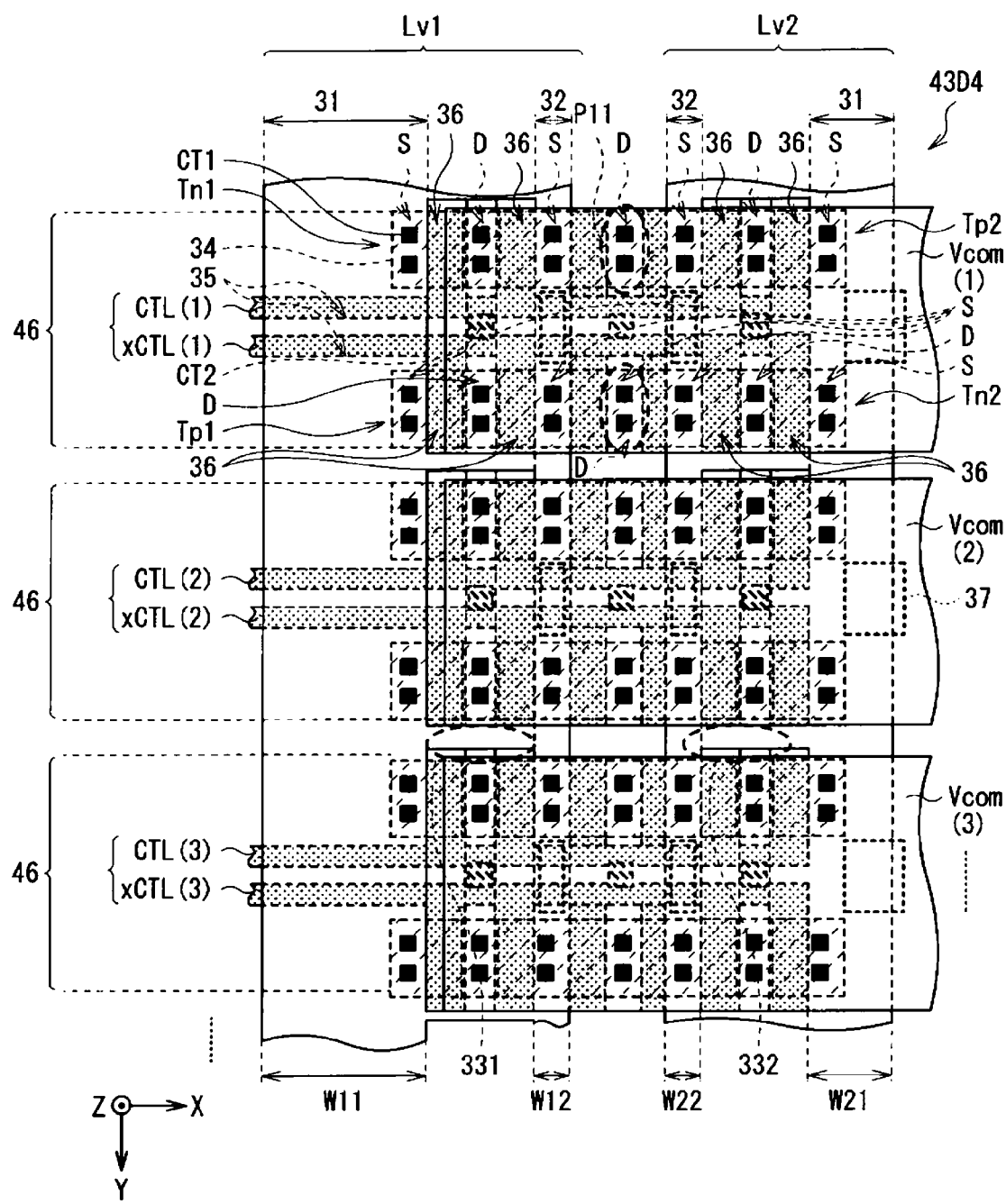
FIG. 16 is a schematic plan view of another example of arrangement configuration of the buffer circuit according to the first modification example.

FIG. 15 and FIG. 16 each show an example of an arrangement configuration (an example of a layout configuration: an example of an X-Y planar configuration) of a buffer circuit (buffer circuit in the COM buffer 43D4 or the like) according to a first modification example. Specifically, FIG. 15 corresponds to a first modification example of the first embodiment, and FIG. 16 corresponds to a first modification example of the second embodiment.

As shown in FIG. 15 and FIG. 16, the present modification example has a through hole (opening) 37 provided in one part of the output signal lines $V_{com}$. Specifically, a plurality of through holes 37 in a rectangular shape are formed in at least one part (a region excluding a region of formation of the contact CT1 in this case) of regions of superposition (overlap regions) of the power supply lines Lv1 and Lv2 and the output signal lines $V_{com}$.

The present modification example can provide the following effects in addition to the effects of the foregoing first and second embodiments. First, a capacitance is formed in the regions of superposition of the power supply lines Lv1 and Lv2 and the output signal lines $V_{com}$, and the capacitance causes an increase in power consumption when the buffer circuit is operated. Accordingly, the through holes 37 are provided within the superposition regions in the output signal lines $V_{com}$ so that an increase in power consumption caused by such a capacitance can be suppressed. Incidentally, while providing such through holes 37 has a disadvantage of an increase in the resistance value of the output signal lines $V_{com}$, the advantage of reducing the value of the capacitance (reducing power consumption) by providing the through holes 37 can be said to be greater.

Second Modification Example (Example of Application to Inverter Circuit Instead of Buffer Circuit)

Figure 17:
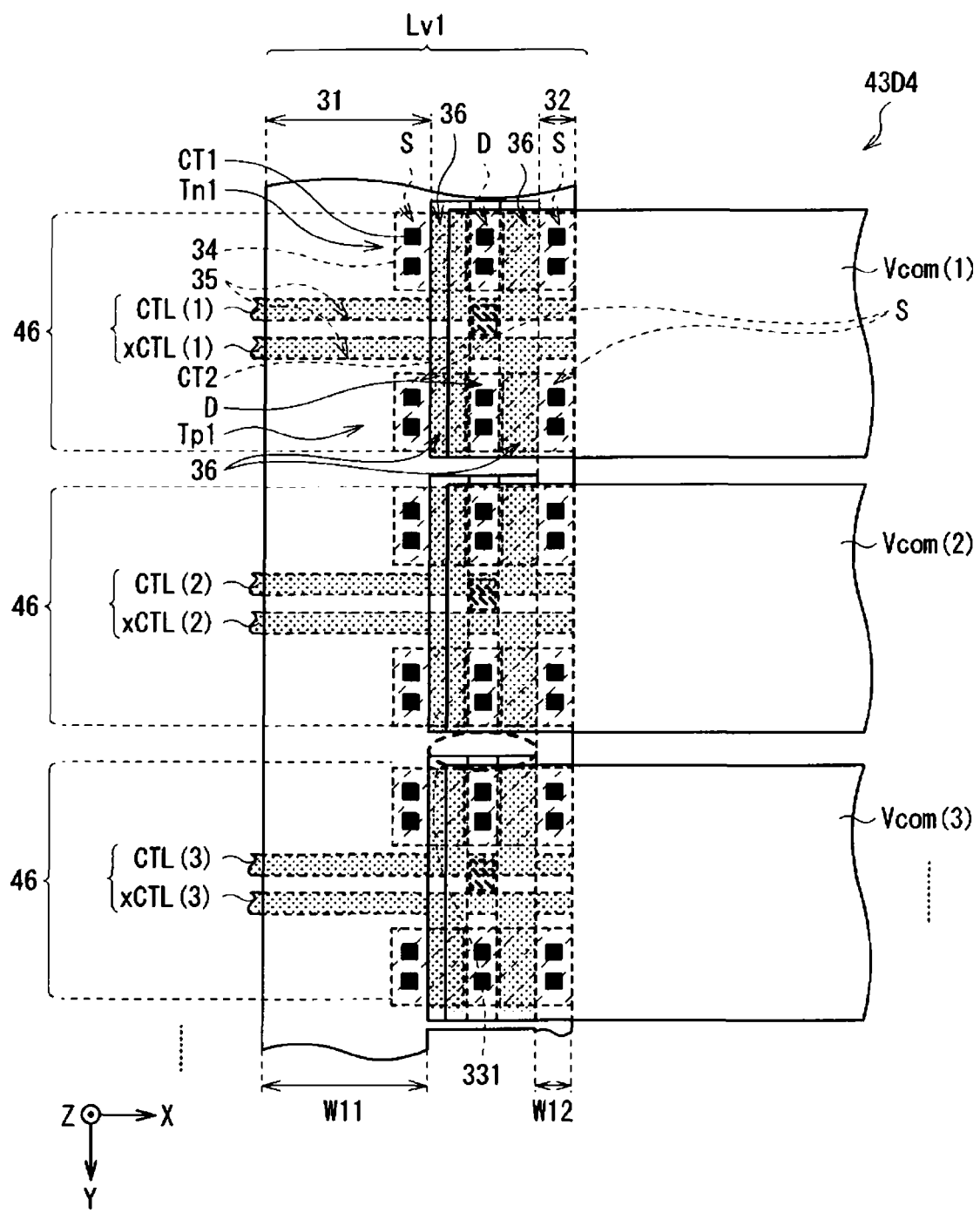
FIG. 17 is a schematic plan view of an example of arrangement configuration of an inverter circuit (semiconductor device) according to a second modification example.
Figure 18:
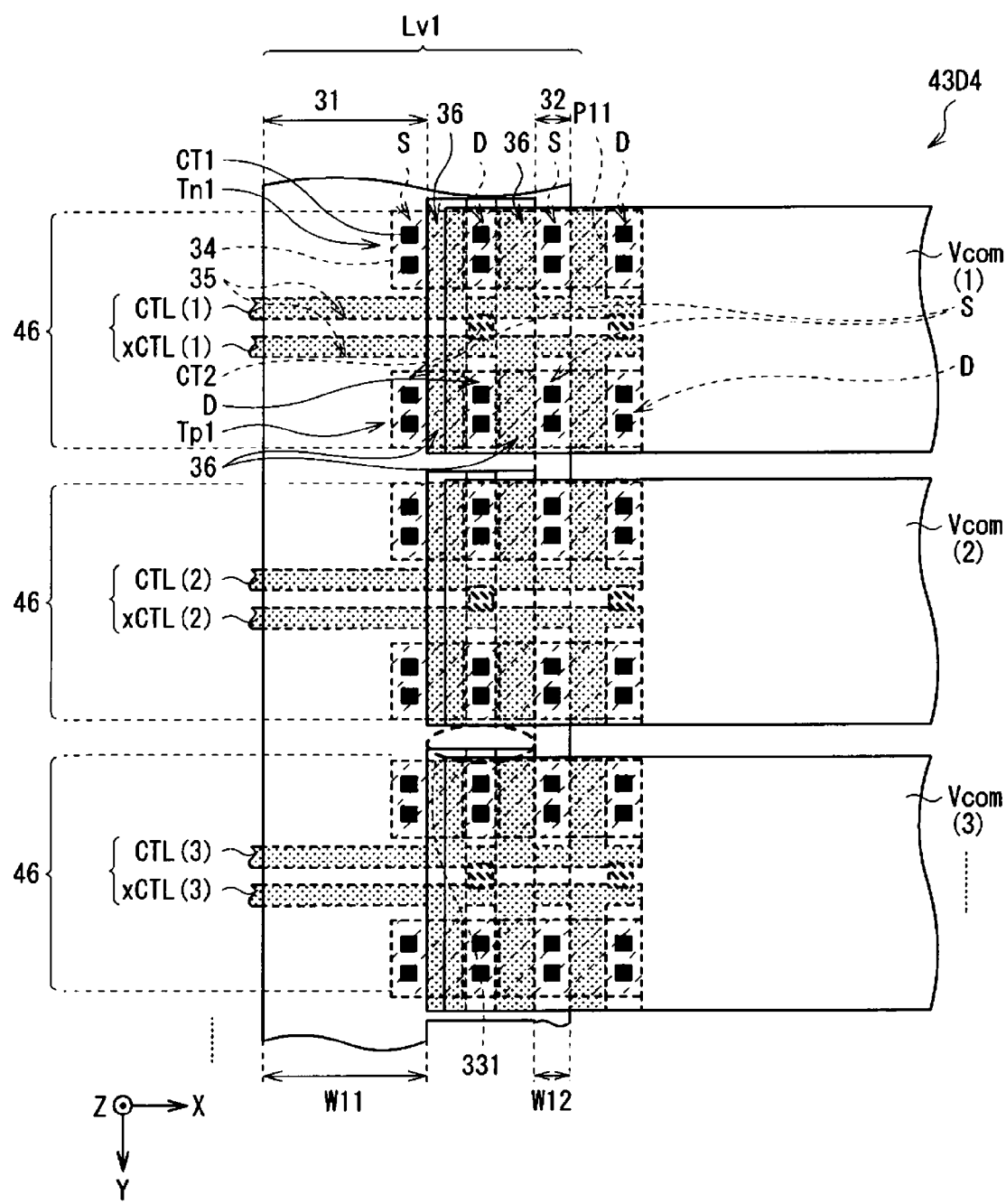
FIG. 18 is a schematic plan view of another example of arrangement configuration of the inverter circuit according to the second modification example.

FIG. 17 and FIG. 18 each show an example of an arrangement configuration (an example of a layout configuration: an example of an X-Y planar configuration) of an inverter circuit (inverter circuit in the COM buffer 43D4 or the like) according to a second modification example. Specifically, FIG. 17 corresponds to a second modification example of the first embodiment, and FIG. 18 corresponds to a second modification example of the second embodiment. Incidentally, this inverter circuit corresponds to a concrete example of the "vertical driving circuit" and the "semiconductor device (semiconductor circuit)" in the embodiments of the present disclosure.

As shown in FIG. 17 and FIG. 18, the present modification example is an example of application to an inverter circuit (logical negation circuit) in place of the buffer circuits described thus far. Specifically, a unit circuit 46 of the inverter circuit is formed by one power supply line Lv1, two control signal lines CTL and xCTL, one output signal line $V_{com}$, and two transistors Tn1 and Tp1. A plurality of such unit circuits 46 are provided along the Y-axis direction.

The inverter circuit formed of such a constitution according to the present modification example can also provide similar effects by similar action to those of the first or second embodiment. That is, it is possible to achieve space saving while suppressing degradation in characteristics, for example.

5. Application Examples (Application Examples of Display Devices to Electronic Devices)

Next, referring to FIGS. 19 to 23G, description will be made of application examples of the display device 1 (display device provided with a touch sensor) described in each of the foregoing embodiments and modification examples. The display device 1 according to the foregoing embodiments and the like is applicable to electronic devices in all fields such as television devices, digital cameras, notebook personal computers, portable terminal devices such as portable telephones, or video cameras. In other words, the display device 1 according to the foregoing embodiments and the like is applicable to electronic devices, in all fields, which display a video signal externally input thereto or a video signal generated therein as an image or video.

First Application Example

Figure 19:
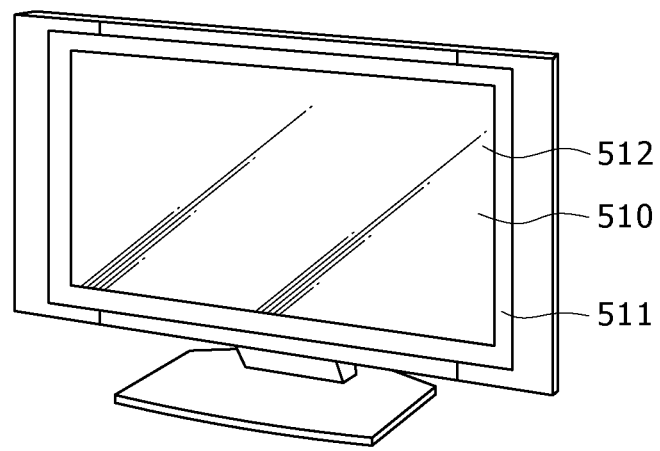

FIG. 19 shows an external appearance of a television device to which the display device 1 according to the foregoing embodiments and the like is applied. This television device has for example a video display screen section 510 including a front panel 511 and a filter glass 512. This video display screen section 510 is formed by the display device 1 according to the foregoing embodiments and the like.

Second Application Example

Figure 20A:
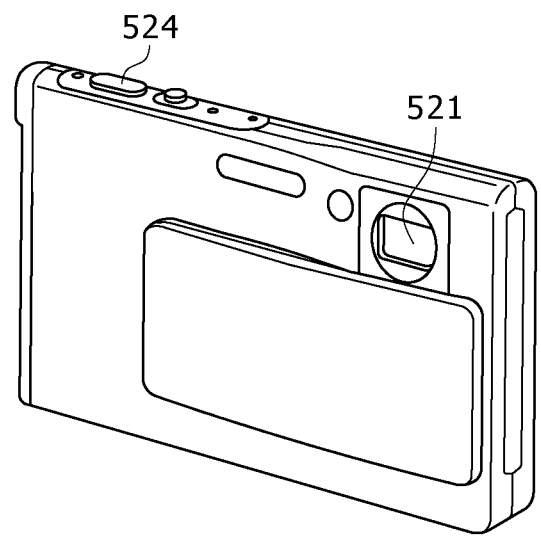
FIG. 20A is a perspective view of an external appearance as viewed from a front side in a second application example.
Figure 20B:
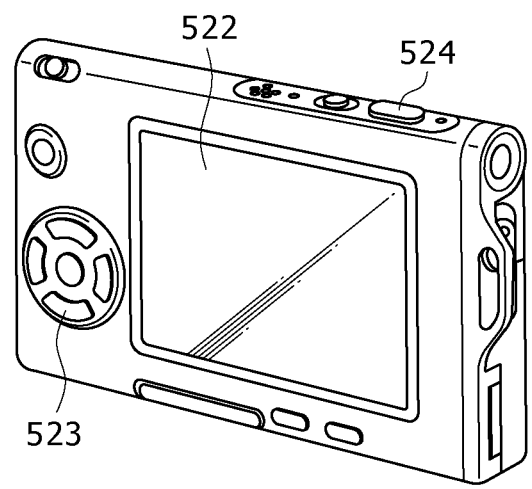
FIG. 20B is a perspective view of an external appearance as viewed from a back side in the second application example.

FIGS. 20A and 20B show an external appearance of a digital camera to which the display device 1 according to the foregoing embodiments and the like is applied. This digital camera has for example a light emitting part 521 for flashlight, a display part 522, a menu switch 523, and a shutter button 524. The display part 522 is formed by the display device 1 according to the foregoing embodiments and the like.

Third Application Example

Figure 21:
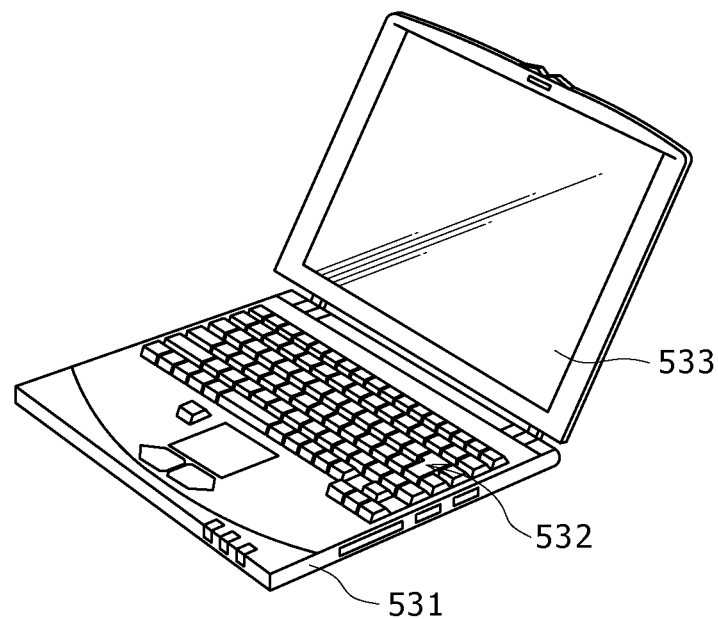
FIG. 21 is a perspective view of an external appearance in a third application example.

FIG. 21 shows an external appearance of a notebook personal computer to which the display device 1 according to the foregoing embodiments and the like is applied. This notebook personal computer has for example a main unit 531, a keyboard 532 for an operation of inputting characters and the like, and a display part 533 for displaying an image. The display part 533 is formed by the display device 1 according to the foregoing embodiments and the like.

Fourth Application Example

Figure 22:
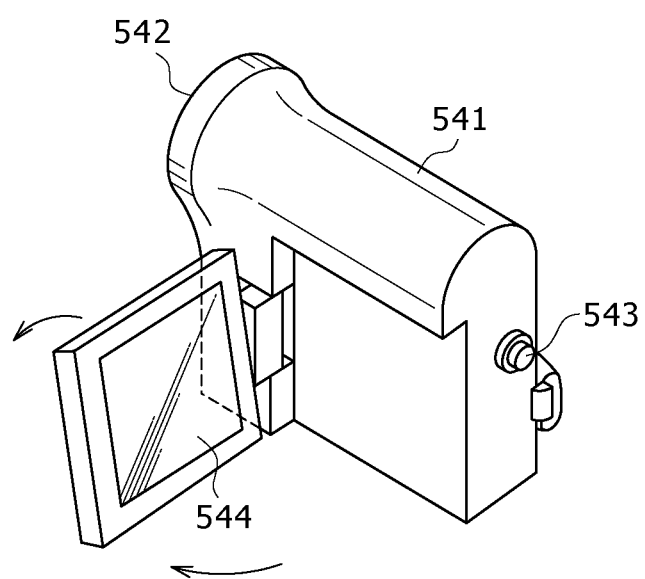
FIG. 22 is a perspective view of an external appearance in a fourth application example.

FIG. 22 shows an external appearance of a video camera to which the display device 1 according to the foregoing embodiments and the like is applied. This video camera has for example a main unit 541, a lens 542 disposed in a front side surface of the main unit 541 for taking a subject, a start/stop switch 543 at a time of picture taking, and a display part 544. The display part 544 is formed by the display device 1 according to the foregoing embodiments and the like.

Fifth Application Example

FIGS. 23A to 23G show an external appearance of a portable telephone to which the display device 1 according to the foregoing embodiments and the like is applied. This portable telephone is for example formed by coupling an upper side casing 710 and a lower side casing 720 by a coupling part (a hinge part) 730. The portable telephone for example has a display 740, a sub-display 750, a picture light 760, and a camera 770. The display 740 or the sub-display 750 is formed by the display device 1 according to the foregoing embodiments and the like.

6. Other Modification Examples

The present technology has been described above by citing embodiments, modification examples, and application examples. However, the present technology is not limited to these embodiments and the like, but is susceptible of various modifications.

For example, in the foregoing embodiments and the like, description has been made by citing concrete arrangement configurations (layout configurations) of buffer circuits and inverter circuits. However, the present technology is not limited to these configurations, and other arrangement configurations can be adopted. For example, the number of divisions in each transistor may be even numbers other than two or odd numbers other than three. In addition, in the foregoing embodiments and the like, description has been made of a case where the "first direction (Y-axis direction)" and the "second direction (X-axis direction)" are substantially orthogonal to each other (are herein orthogonal to each other). However, the first direction and the second direction do not necessarily have to be substantially orthogonal to each other. Further, in the foregoing embodiments and the like, description has been made of a case where each transistor has a so-called bottom gate type structure as shown in FIG. 11, for example. However, the present technology is not limited to this. Each transistor may have a top gate type structure.

In addition, in the foregoing embodiments and the like, description has been made by taking a buffer circuit and an inverter circuit as examples of a "vertical driving circuit (semiconductor device)." However, the present technology is not limited to these circuits, and is also applicable to other circuits.

Further, in the foregoing embodiments and the like, description has been made of a display device provided with a touch sensor (display device having a touch sensor function) as an example of display devices. However, the present technology is not limited to this, and is also applicable to ordinary display devices without such a touch sensor function.

In addition, in the foregoing embodiments and the like, description has been made of a display device using a liquid crystal element as a display element (liquid crystal display device). However, the present technology is also applicable to display devices using other display elements, for example an organic EL (electro luminescence) element (organic EL display devices).

Further, in the foregoing embodiments and the like, description has been made by citing a display device as an example of a device having a "vertical driving circuit (semiconductor device)." However, the present technology is not limited to this. A "vertical driving circuit (semiconductor device)" according to an embodiment of the present disclosure is also applicable to devices other than display devices.

Incidentally, the present technology can also adopt the following constitutions.

(1) A semiconductor device including:
one or a plurality of pieces of first wiring extending along a first direction on a substrate and having a main wiring section and a bifurcation wiring section arranged so as to be separated from each other;
one or a plurality of pieces of second wiring having a trunk wiring section extending along a second direction different from the first direction on the substrate, and a plurality of branch wiring sections extending along the first direction within a gap region between the main wiring section and the bifurcation wiring section;
one or a plurality of transistors each divided and formed into a plurality of pieces along the second direction, the plurality of branch wiring sections individually functioning as a gate electrode, and the one or plurality of transistors having a source region formed within the main wiring section and within the bifurcation wiring section and having a drain region formed between the plurality of branch wiring sections; and
one or a plurality of pieces of third wiring extending along the second direction and electrically connected to the drain region of the one or plurality of transistors.

(2) The semiconductor device according to the above (1),
in which the one or plurality of transistors are divided and formed into an even number of pieces.

(3) The semiconductor device according to the above (1),
in which the one or plurality of transistors are divided and formed into an odd number of pieces.

(4) The semiconductor device according to one of the above (1) to (3),
in which one buffer circuit as a unit circuit is formed by two pieces of the first wiring, two pieces of the second wiring, four of the transistors, and one piece of the third wiring.

(5) The semiconductor device according to one of the above (1) to (3),
in which one inverter circuit as a unit circuit is formed by one piece of the first wiring, two pieces of the second wiring, two of the transistors, and one piece of the third wiring.

(6) The semiconductor device according to the above (4) or (5),
in which the first wiring is a power supply line, the second wiring is a control signal line, and the third wiring is an output signal line, and
the first wiring, the second wiring, and the third wiring are formed in respective layers different from each other.

(7) The semiconductor device according to the above (6),
in which a plurality of the unit circuits are disposed along the first direction.

(8) The semiconductor device according to the above (7),
in which the plurality of unit circuits sequentially operate along the first direction according to a control signal supplied from the control signal line.

(9) The semiconductor device according to one of the above (1) to (8),
in which the third wiring has a through hole in at least a part of a region of superposition of the first wiring and the third wiring.

(10) The semiconductor device according to one of the above (1) to (9),
in which the first wiring has a connecting part for electrically connecting the main wiring section and the bifurcation wiring section to each other within the gap region.

(11) The semiconductor device according to one of the above (1) to (10),
in which the first direction and the second direction are substantially orthogonal to each other.

(12) A display device including:
a display section; and
a driving section including a semiconductor device,
in which the semiconductor device includes
one or a plurality of pieces of first wiring extending along a first direction on a substrate and having a main wiring section and a bifurcation wiring section arranged so as to be separated from each other,
one or a plurality of pieces of second wiring having a trunk wiring section extending along a second direction different from the first direction on the substrate, and a plurality of branch wiring sections extending along the first direction within a gap region between the main wiring section and the bifurcation wiring section,
one or a plurality of transistors each divided and formed into a plurality of pieces along the second direction, the plurality of branch wiring sections individually functioning as a gate electrode, and the one or plurality of transistors having a source region formed within the main wiring section and within the bifurcation wiring section and having a drain region formed between the plurality of branch wiring sections, and
one or a plurality of pieces of third wiring extending along the second direction and electrically connected to the drain region of the one or plurality of transistors.

(13) The display device according to the above (12),
in which the display section is disposed in an effective display region, and
the driving section is disposed within a frame region situated at an outer edge of the effective display region.

(14) The display device according to the above (13),
in which the display section has a plurality of pixels, and
the semiconductor device is a vertical driving circuit for sequentially driving the plurality of pixels along the first direction.

(15) The display device according to the above (14),
in which the driving section has a horizontal driving circuit including a plurality of transistors, and
each of gate electrodes of transistors in the vertical driving circuit and the horizontal driving circuit is disposed so as to extend along the first direction.

(16) The display device according to the above (15),
in which each of the transistors in the vertical driving circuit and the horizontal driving circuit includes a polycrystalline semiconductor layer.

(17) The display device according to the above (16),
in which the polycrystalline semiconductor layer is formed by subjecting an amorphous semiconductor layer to a laser annealing process along a predetermined direction.

(18) The display device according to one of the above (12) to (17),
in which the display device has a touch sensor function.

(19) The display device according to one of the above (12) to (18),
in which the display section is formed by using a liquid crystal element or an organic EL element.

(20) An electronic device including:
a display device including a display section and a driving section having a semiconductor device,
in which the semiconductor device includes
one or a plurality of pieces of first wiring extending along a first direction on a substrate and having a main wiring section and a bifurcation wiring section arranged so as to be separated from each other,
one or a plurality of pieces of second wiring having a trunk wiring section extending along a second direction different from the first direction on the substrate, and a plurality of branch wiring sections extending along the first direction within a gap region between the main wiring section and the bifurcation wiring section,
one or a plurality of transistors each divided and formed into a plurality of pieces along the second direction, the plurality of branch wiring sections individually functioning as a gate electrode, and the one or plurality of transistors having a source region formed within the main wiring section and within the bifurcation wiring section and having a drain region formed between the plurality of branch wiring sections, and
one or a plurality of pieces of third wiring extending along the second direction and electrically connected to the drain region of the one or plurality of transistors.

The present disclosure contains subject matter related to that disclosed in Japanese Priority Patent Application JP 2011-099345 filed in the Japan Patent Office on Apr. 27, 2011, the entire content of which is hereby incorporated by reference.

What is claimed is:

1. A semiconductor device comprising:
a first wiring extending along a first direction on a substrate and having a main wiring section and a bifurcation wiring section arranged so as to be separated from each other;
a second wiring extending along a second direction different from the first direction on the substrate;
a transistor having (a) a source region electrically connected to the main wiring section, (b) a drain region and (c) a gate electrode that extends along the first direction within a gap region between (i) the main wiring section and (ii) the bifurcation wiring section and that is electrically connected to the second wiring, the source region, the drain region and the gate electrode being arranged along the second direction; and
a third wiring extending along the second direction and electrically connected to the drain region of the transistor,
wherein,
the second wiring, the first wiring, and the third wiring are sequentially stacked on the substrate in respective different layers in a third direction orthogonal to the first direction and the second direction.

2. The semiconductor device according to claim 1, wherein a plurality of the transistors are disposed adjacent for each other along the first direction.

3. The semiconductor device according to claim 1, wherein the transistor has two gate electrodes.

4. The semiconductor device according to claim 1, wherein the first wiring has a connecting part for electrically connecting the main wiring section and the bifurcation wiring section to each other within the gap region overlapping the second wiring in a planar view.

5. The semiconductor device according to claim 1, further comprising a plurality of first wirings, a plurality of transistors, and a buffer circuit as a unit circuit formed of the plurality of the first wirings and the plurality of the transistors.

6. The semiconductor device according to claim 5, wherein:
each drain region is disposed between the first wirings, and
for each transistor, the gate electrode is disposed between the source region and the drain region and is electrically connected to the second wiring.

7. The semiconductor device according to claim 1, wherein the gate electrode, the drain region of the transistor, and the third wiring are sequentially stacked on the substrate in respective different layers in the third direction.

* * * * *